United States Patent
Chen et al.

(10) Patent No.: US 10,038,092 B1
(45) Date of Patent: Jul. 31, 2018

(54) THREE-LEVEL FERROELECTRIC MEMORY CELL USING BAND ALIGNMENT ENGINEERING

(71) Applicant: SanDisk Technologies LLC, Plano, TX (US)

(72) Inventors: Yangyin Chen, Heverlee (BE); Christopher J Petti, Mountain View, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/604,162

(22) Filed: May 24, 2017

(51) Int. Cl.
*G11C 11/22* (2006.01)
*H01L 29/78* (2006.01)
*H01L 29/51* (2006.01)
*H01L 27/1159* (2017.01)
*H01L 27/11597* (2017.01)
*H01L 27/11592* (2017.01)

(52) U.S. Cl.
CPC ........ *H01L 29/78391* (2014.09); *G11C 11/22* (2013.01); *G11C 11/2275* (2013.01); *H01L 27/1159* (2013.01); *H01L 27/11592* (2013.01); *H01L 27/11597* (2013.01); *H01L 29/516* (2013.01)

(58) Field of Classification Search
CPC ............................ G11C 11/1675; G11C 11/22
USPC ................................................. 365/145, 158
See application file for complete search history.

(56) References Cited

U.S. PATENT DOCUMENTS 5,191,834 A * 3/1993 Fuhrmann ............. B41C 1/1058
                                                        101/130
5,666,305 A * 9/1997 Mihara ................... G11C 11/22
                                                        257/295

(Continued)

FOREIGN PATENT DOCUMENTS

EP          3038141 A1    6/2016
KR       20090105590 A   10/2009
WO    WO2014/186529 A1    5/2013

OTHER PUBLICATIONS

Mulaosmanovic, H., et al., "Evidence of single domain switching in Hafnium Oxide based FeFETs: enabler for multi-level FeFET Memory cells," 2015 IEEE International Electron Devices Meeting (IEDM), Dec. 2015, 3 pages.

(Continued)

*Primary Examiner* — Michael Tran
(74) *Attorney, Agent, or Firm* — Vierra Magen Marcus LLP

(57) ABSTRACT

A non-volatile memory cell stores 1.5 bits of data in three polarization states. The memory cell may have two ferroelectric layers and three electrodes. The energy bands of the ferroelectric layers are adjusted by providing two of the electrodes with different work functions. The difference in the work functions may be significant, such as at least 0.4-0.6 V or more. Two of the electrodes may have equal or similar work functions. For example, the work functions may be equal within a tolerance of +/−0.1 V. The memory cell can be arranged in various configurations including a FeFET (ferroelectric field effect transistor) and a FeRAM (ferroelectric random access memory). A set of memory cells can be arranged in a string such as a NAND string.

12 Claims, 20 Drawing Sheets

(56) References Cited

U.S. PATENT DOCUMENTS

| | | | | |
|---|---|---|---|---|
| 5,877,977 | A * | 3/1999 | Essaian | H01L 29/7881 257/E29.272 |
| 6,342,337 | B1 * | 1/2002 | Yamanobe | H01L 27/105 216/52 |
| 6,420,740 | B1 * | 7/2002 | Zhang | H01L 21/31604 257/295 |
| 6,853,575 | B2 | 2/2005 | Kang | |
| 7,431,811 | B2 | 10/2008 | Chou et al. | |
| 8,081,501 | B2 | 12/2011 | Choi et al. | |
| 8,737,111 | B2 | 5/2014 | Kreupl et al. | |
| 9,558,804 | B2 | 1/2017 | Muller | |
| 2001/0054733 | A1 * | 12/2001 | Agarwal | H01L 28/55 257/310 |
| 2002/0063271 | A1 | 5/2002 | Kim | |
| 2002/0075736 | A1 * | 6/2002 | Kumura | H01L 27/11502 365/200 |
| 2002/0125517 | A1 * | 9/2002 | Nakamura | G11C 29/50 257/295 |
| 2002/0168785 | A1 * | 11/2002 | Paz de Araujo | H01L 21/02197 438/3 |
| 2002/0185690 | A1 * | 12/2002 | Ueda | G11C 27/005 257/368 |
| 2003/0136989 | A1 * | 7/2003 | Amiotti | H01L 28/55 257/296 |
| 2003/0222279 | A1 * | 12/2003 | Jacob | G11C 11/22 257/200 |
| 2004/0195937 | A1 * | 10/2004 | Matsubara | H03H 9/02102 310/320 |
| 2004/0201050 | A1 * | 10/2004 | Koiwa | H01L 28/55 257/295 |
| 2006/0228855 | A1 * | 10/2006 | Min | H01G 4/005 438/240 |
| 2007/0107774 | A1 * | 5/2007 | Jin | C23C 14/08 136/258 |
| 2007/0114594 | A1 * | 5/2007 | Ono | H01L 29/42324 257/317 |
| 2008/0011996 | A1 | 1/2008 | Bednorz et al. | |
| 2008/0107885 | A1 * | 5/2008 | Alpay | H01L 28/56 428/220 |
| 2009/0021975 | A1 * | 1/2009 | Rao | G11B 9/02 365/145 |
| 2009/0040808 | A1 * | 2/2009 | Krieger | G11C 11/22 365/145 |
| 2009/0289526 | A1 * | 11/2009 | Sinha | H03H 9/15 310/325 |
| 2010/0052021 | A1 * | 3/2010 | Mocho | H01L 27/11509 257/295 |
| 2011/0146308 | A1 * | 6/2011 | Casasanta | F25B 21/00 62/113 |
| 2014/0264515 | A1 * | 9/2014 | Fabiano | H01L 29/66477 257/295 |
| 2014/0376296 | A1 | 12/2014 | Lee et al. | |
| 2016/0064666 | A1 * | 3/2016 | Chan | H01L 45/145 257/4 |
| 2016/0141366 | A1 * | 5/2016 | Lai | H01L 29/1033 257/9 |
| 2016/0308070 | A1 * | 10/2016 | Chang | H01L 29/792 |
| 2016/0359109 | A1 * | 12/2016 | Kamimuta | H01L 45/04 |
| 2016/0365133 | A1 * | 12/2016 | Ino | G11C 11/2273 |
| 2017/0162250 | A1 * | 6/2017 | Slesazeck | G11C 11/2275 |
| 2017/0162500 | A1 * | 6/2017 | Lee | H01L 23/49816 |
| 2017/0345831 | A1 * | 11/2017 | Chavan | H01L 27/11507 |

OTHER PUBLICATIONS

Sarakinos, Kostas D., et al., "On the phase formation of sputtered hafnium oxide and oxynitride films," Journal of Applied Physics, May 2010, 9 pages.

Pesic, Milan, et al., "How to make DRAM non-volatile? Anti-ferroelectrics: A new paradigm for universal memories," 2016 IEEE International Electron Devices Meeting (IEDM), Dec. 2016, 4 pages.

Schroeder, Uwe, et al., "Impact of different dopants on the switching properties of ferroelectric hafniumoxide," Japanese Journal of Applied Physics 53, Jul. 2014, 6 pages.

Schroeder, U., et al., "Hafnium Oxide Based CMOS Compatible Ferroelectric Materials," ECS Journals of Solid State Science and Technology, Jan. 2013, 4 pages.

Bascke, T S, et al., Ferroelectricity in hafnium oxide thin films, Applied Physics Letters, AIP Publishing LLC, vol. 99, No. 10, Sep. 5, 2011, 3 pages.

Chernikova, Anna, et al., "Ultrathin Hf 0.5 Zr 0.5 0 2 Ferroelectric Films on Si," ACS Applied Materials & Interaces, vol. 8, No. 11, Mar. 14, 2016, 6 pages.

Chen, Kuen-Yi, et al., "Ferroelectricity of low thermal-budget HfAlOx for devices with metal-ferroelectric-insulator-semiconductor structure," RSC Advances, vol. 6, No. 78, Jan. 1, 2016, 8 pages.

English Abstract of KR Publication No. 2009-0105590 published on Oct. 7, 2009.

\* cited by examiner

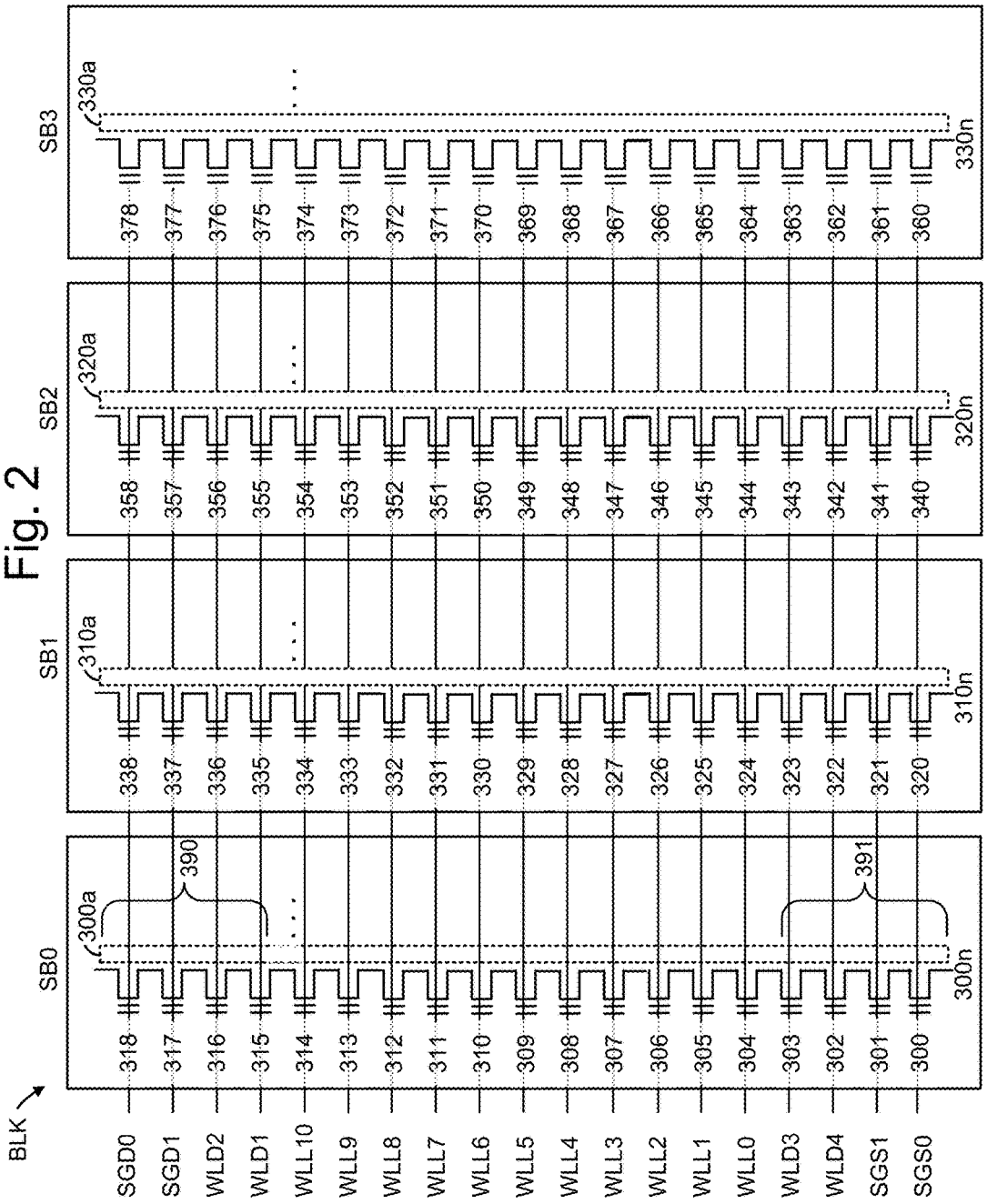

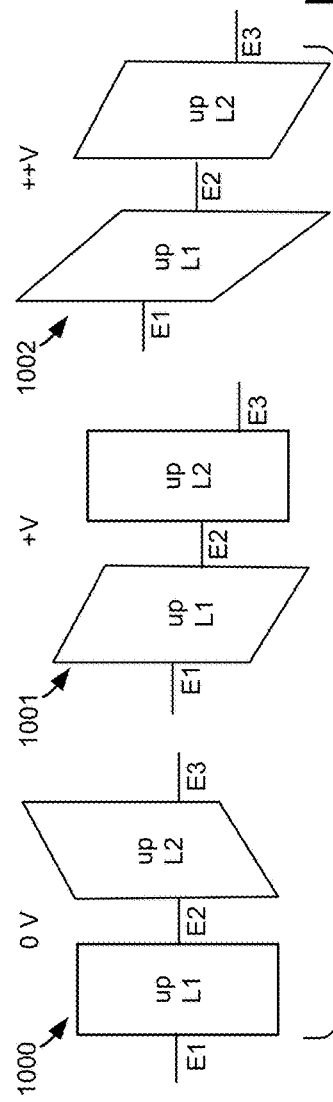
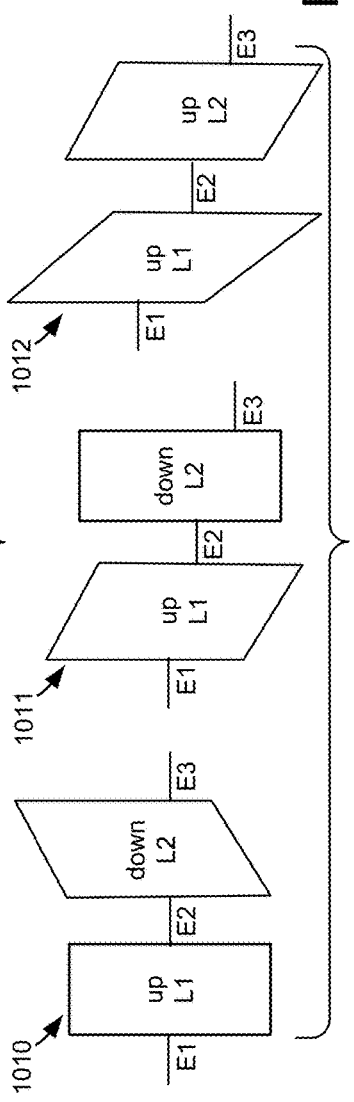
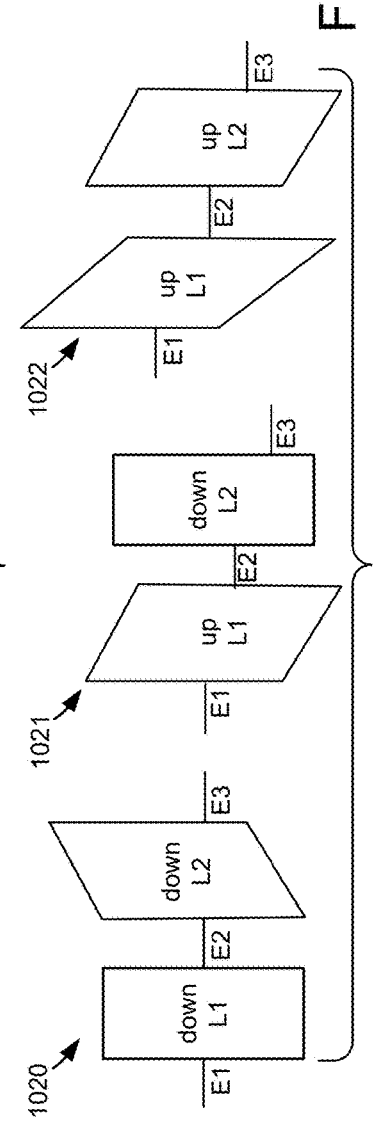
Fig. 10B
Fig. 10C
Fig. 10D

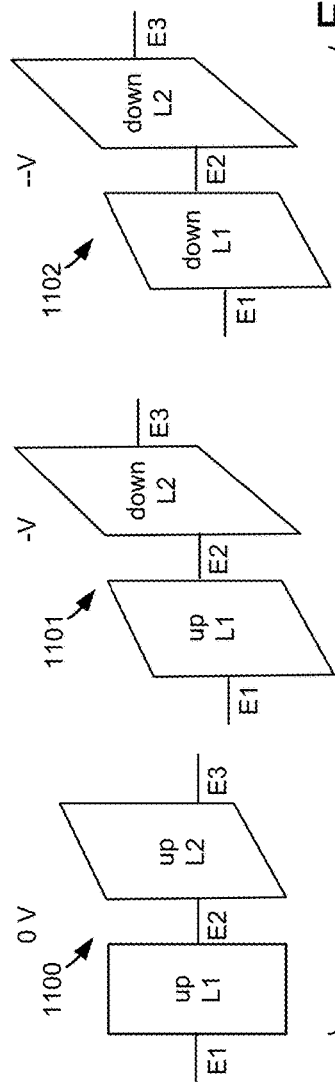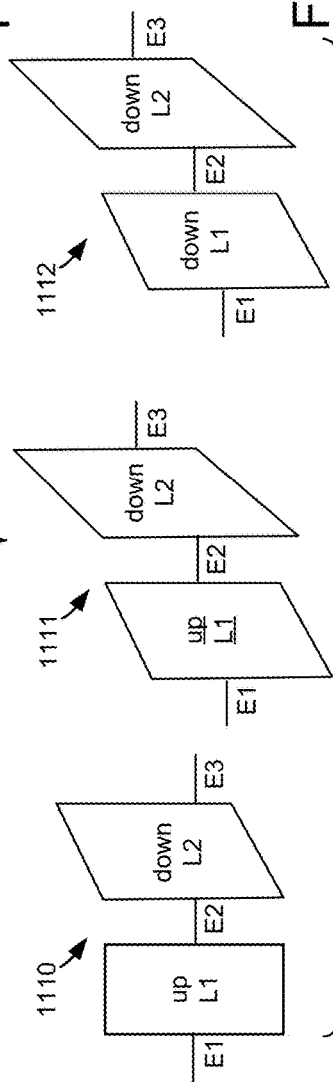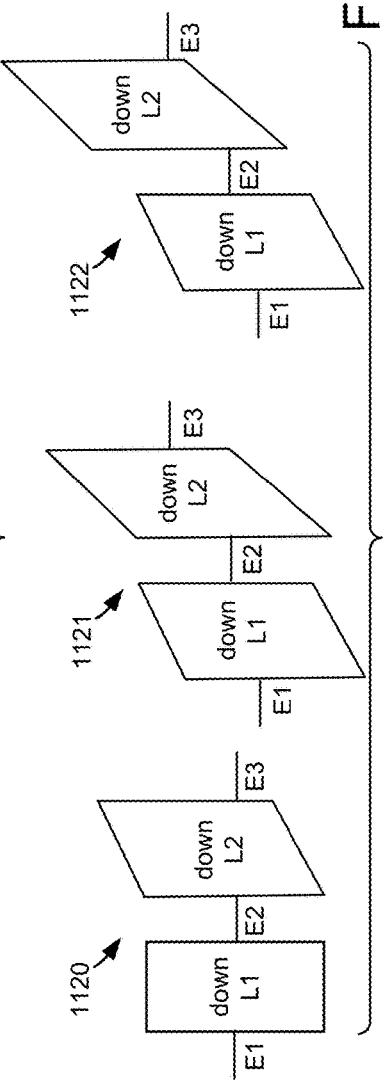

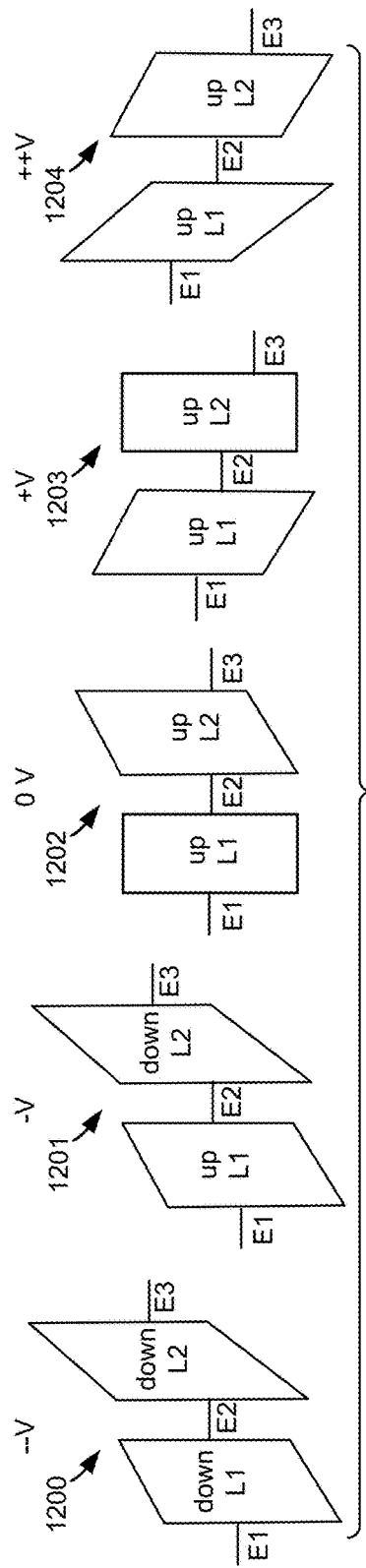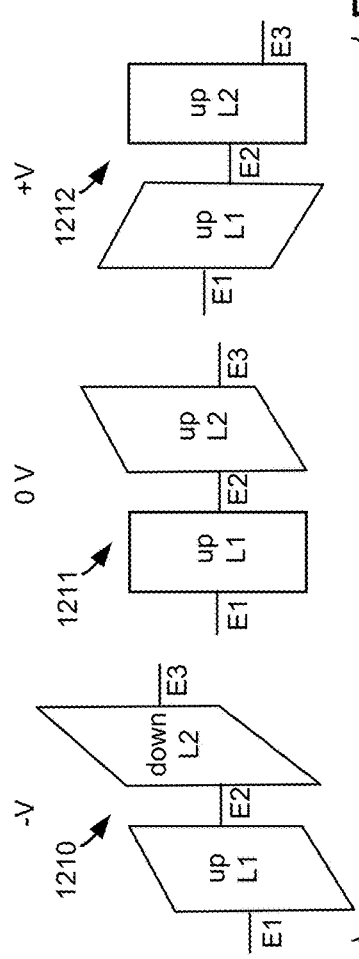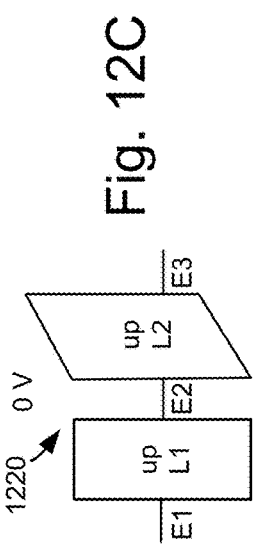
Fig. 12A
Fig. 12B
Fig. 12C

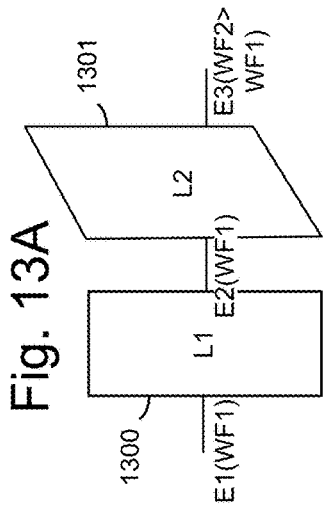
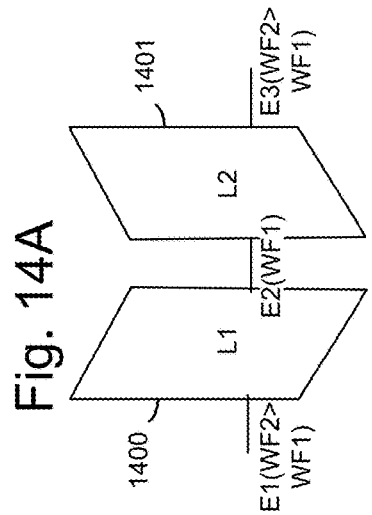
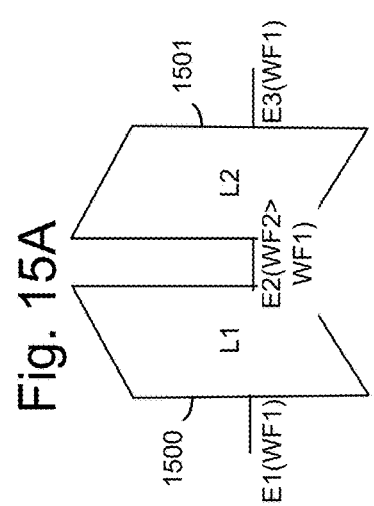

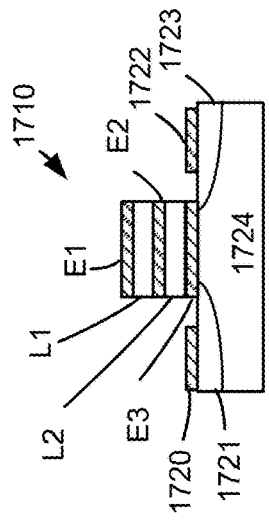
Fig. 16B
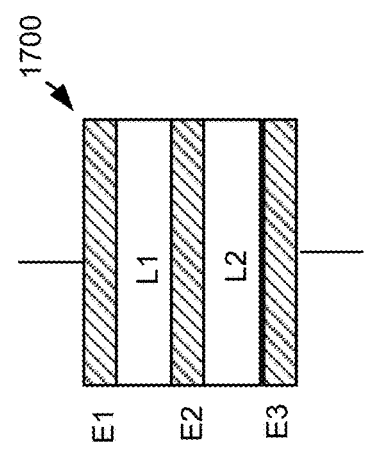
Fig. 17B
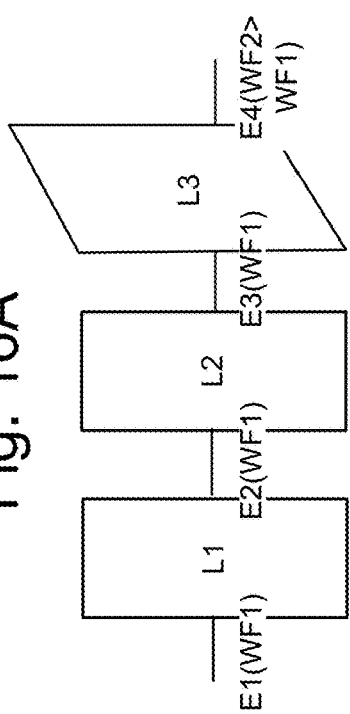
Fig. 16A
Fig. 17A

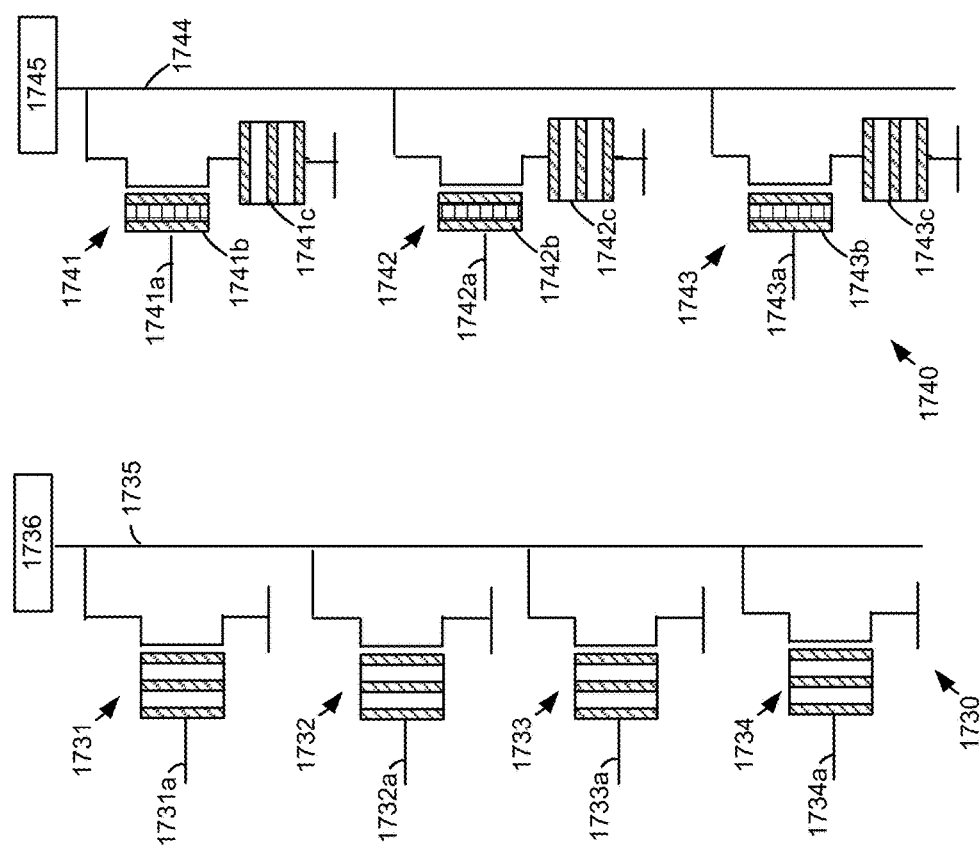

THREE-LEVEL FERROELECTRIC MEMORY CELL USING BAND ALIGNMENT ENGINEERING

The present technology relates to memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

Various types of non-volatile memory cells can be used in such memory devices. In one approach, a charge-storing material such as a floating gate or a charge-trapping material can be used in a memory cell to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers. In another approach, a memory cell comprises a resistance-switching material. Other types of non-volatile memory cells can be used as well.

BRIEF DESCRIPTION OF THE DRAWINGS

FIG. 2 depicts an example implementation of the memory structure 126 of FIG. 1 comprising NAND strings in sub-blocks in a 3D configuration.

FIG. 10B is an example sequence of energy band diagrams for a memory cell having two polarizable layers and three polarization states consistent with FIG. 9B, where the cell is initially in an up-up or positive polarization state with a bias of 0 V, and remains at the up-up state when biased with a relatively weak positive voltage +V and then a relatively strong positive voltage of ++V.

FIG. 10C is an example sequence of energy band diagrams for a memory cell having two polarizable layers and three polarization states consistent with FIG. 9B, where the cell is initially in an up-down or neutral polarization state with a bias of 0 V, remains at the up-down state when biased with +V and then transitions to the up-up state when biased with ++V.

FIG. 10D is an example sequence of energy band diagrams for a memory cell structure having two polarizable layers and three polarization states consistent with FIG. 9B, where the cell is initially at a down-down or negative polarization state with a bias of 0 V, transitions to the up-down state when biased with +V and then transitions to the up-up state when biased with ++V.

FIG. 11A is an example sequence of energy band diagrams for a memory cell having two polarizable layers and three polarization states consistent with FIG. 9B, where the cell is initially in an up-up state with a bias of 0 V, transitions to the up-down state when biased with a relatively weak negative voltage −V and then transitions to the down-down state when biased with a relatively strong negative voltage of −−V.

FIG. 11B is an example sequence of energy band diagrams for a memory cell having two polarizable layers and three polarization states consistent with FIG. 9B, where the cell is initially in an up-down state with a bias of 0 V, remains in the up-down state when biased with −V and then transitions to the down-down state when biased with −−V.

FIG. 11C is an example sequence of energy band diagrams for a memory cell having two polarizable layers and three polarization states consistent with FIG. 9B, where the cell is initially at a down-down state with a bias of 0 V, and remains in the down-down state when biased with −V and then −−V.

FIG. 12A is an example sequence of energy band diagrams for a memory cell having two polarizable layers and three polarization states consistent with FIG. 9B, where the cell is initially at a down-down state with a bias of −−V, transitions to the up-down state with a bias of −V, then to the up-up state with a bias of 0 V, and then remains in the up-up state with a bias of +V and then ++V.

FIG. 12B is an example sequence of energy band diagrams for a memory cell having two polarizable layers and three polarization states consistent with FIG. 9B, where the cell is initially in an up-down state with a bias of −V, transitions to the up-up state with a bias of 0 V, and then remains in the up-up state with a bias of +V.

FIG. 12C is an example energy band diagram for a memory cell having two polarizable layers and three polarization states consistent with FIG. 9B, where the cell is in an up-up state with a bias of 0 V.

FIG. 13A is an example energy band diagram for a memory cell having two polarizable layers and three polarization states consistent with FIG. 9B, where the cell has electrodes E1 and E2 with a relatively low work function WF1 and an electrode E3 with a relatively high work function WF2>WF1.

FIG. 13B is an example table of switching voltages consistent with FIG. 13A.

FIG. 14A is an example energy band diagram for a memory cell having two polarizable layers and three polarization states consistent with FIG. 9B, where the cell has electrodes E1 and E3 with a relatively high work function WF2 and an electrode E2 with a relatively low work function WF1.

FIG. 14B is an example table of switching voltages consistent with FIG. 14A.

FIG. 15A is an example energy band diagram for a memory cell having two polarizable layers and three polarization states consistent with FIG. 9B, where the cell has electrodes E1 and E3 with a relatively low work function WF1 and an electrode E3 with a relatively high work function WF2.

FIG. 15B is an example table of switching voltages consistent with FIG. 15A.

FIG. 16A depicts example energy bands of a memory cell having three polarizable layers, where a work function WF2 of the electrode E4 is greater than the word function WF1 of the electrodes E1 E2 and E2.

FIG. 16B depicts a table showing net polarization of a memory cell consistent with FIG. 16A with different polarizations of the layers.

FIG. 17A depicts an example memory cell having two polarizable layers L1 and L2 and three electrodes E1, E2 and E3, in a two terminal configuration.

FIG. 17B depicts an example memory cell having two polarizable layers L1 and L2 and three electrodes E1, E2 and E3, in a three terminal configuration.

FIG. 17C depicts an example string of memory cells having two polarizable layers in a FeFET configuration, where the memory cells are arranged in parallel.

FIG. 17D depicts an example string of memory cells having two polarizable layers in a FeRAM configuration, where the memory cells are arranged in parallel.

FIG. 17E depicts example strings of memory cells having two polarizable layers in a FeFET configuration, where the memory cells are arranged in series in a NAND configuration.

DETAILED DESCRIPTION

Apparatuses and techniques are described for providing a three-level ferroelectric memory cell. The cell is obtained by using band alignment engineering to adjust the energy bands of two ferroelectric layers by providing electrodes with different work functions.

Ferroelectric materials exhibit polarization and therefore have the ability to switch between two polarized states to represent a bit of data. Specifically, ferroelectric switching can involve an up or down movement of Oxygen atoms in a lattice. Examples of ferroelectric materials include perovskites and high-k metal oxides such as $HfO_2$ and $ZrO_2$. Other examples of ferroelectric materials include doped metal oxides such as $HfO_2$ doped with Al, Si or Zr. A memory cell formed of these materials can store binary non-volatile data. A high-k material is a dielectric material with a dielectric constant k greater than the dielectric constant of silicon dioxide (e.g., greater than k=3.9 to 4.2).

However, storing only one bit per memory cell limits the storage density of a memory device. Techniques provides herein address the above and other issues. In one approach, a non-volatile memory cell is provided which stores 1.5 bits of data in three polarization states. The memory cell may have two ferroelectric layers and three electrodes. The energy bands of the ferroelectric layers are adjusted by providing two of the electrodes with different work functions. The difference in the work functions may be significant, such as at least 0.4-0.6 V or more. Two of the electrodes may have equal or similar work functions. For example, the work functions may be equal within a tolerance of +/−0.1 V.

The memory cell can be arranged in various configurations including a FeFET (ferroelectric field effect transistor) and a FeRAM (ferroelectric random access memory).

A set of memory cells can be arranged in a string such as a NAND string. In the NAND string, there is a sufficient voltage margin to provide unselected memory cells in a conductive state while applying a read voltage to a selected memory cell and sensing a current in the selected memory cell. Moreover, in 3D configuration in which the NAND strings extend vertically from a substrate, the memory cells can have a reduced height compared to other configurations such as charge trapping memory cells.

These and other features are discussed herein.

Figure 1:
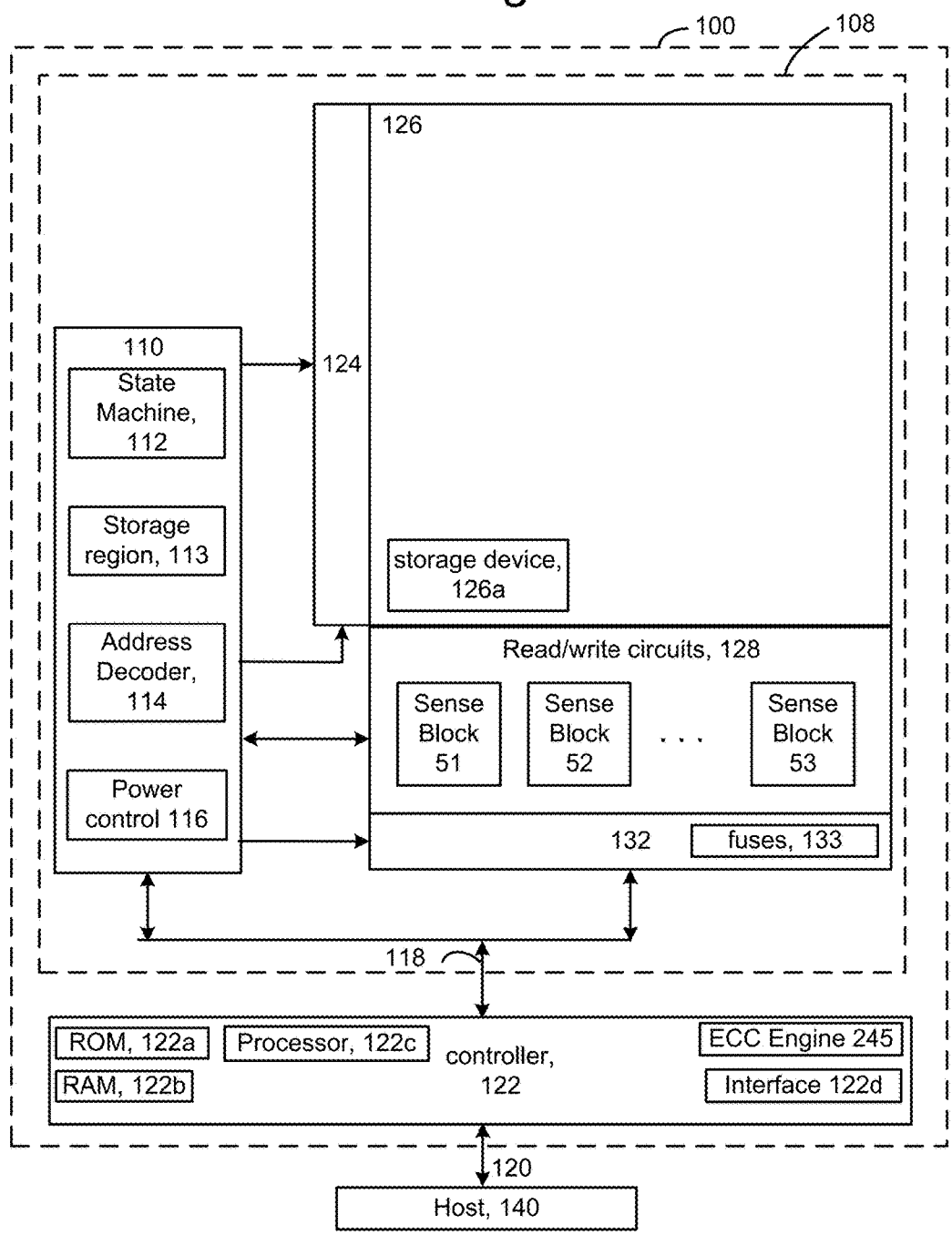
FIG. 1 is a block diagram of an example memory device.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

ROM fuses 133 may be used to physically connect auxiliary pages to control lines such as word lines in place of bad primary pages of memory cells.

In one example, the memory structure includes a set of blocks of memory cells.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114 and a power control module 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can detect and correct a number of read errors. The ECC engine can employ one or more error correcting or error detecting codes, such as a Reed-Solomon code, a Bose, Chaudhuri and Hocquenghem (BCH) code, a cyclic redundancy check (CRC) code, or any other suitable error correcting or detecting code.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 2 depicts an example implementation of the memory structure 126 of FIG. 1 comprising NAND strings in sub-blocks in a 3D configuration. In one approach, a block BLK of memory cells is formed from a stack of alternating conductive and dielectric layers. The block comprises conductive layers spaced apart vertically, and the conductive layers spaced apart vertically comprise word lines connected to the memory cells and select gate lines connected to SGD (drain-side select gate) and SGS (source-side select gate) transistors. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Each NAND string may be formed in a memory hole in the stack is filled with materials which form memory cells adjacent to the word lines.

Further, each block can be divided into sub-blocks and each sub-block includes multiple NAND strings, where one example NAND string is depicted. For example, sub-blocks SB0, SB1, SB2 and SB3 comprise example NAND strings 300*n*, 310*n*, 320*n* and 330*n*, respectively. The NAND strings have data word lines, dummy word lines and select gate lines. Each sub-block comprises a set of NAND strings which extend in the x direction and which have a common SGD line. The NAND strings 300n, 310n, 320n and 330n are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 300n, 310n, 320n and 330n have channels 300a, 310a, 320a and 330a, respectively. Each channel has a drain end and a source end. For example, the channel 300a has a drain end 390 and a source end 391.

Additionally, NAND string 300n includes SGS transistors 300 and 301, dummy memory cells 302 and 303, data memory cells 304, 305, 306, 307, 308, 309, 310, 311, 312, 313 and 314, dummy memory cells 315 and 316, and SGD transistors 317 and 318.

NAND string 310n includes SGS transistors 320 and 321, dummy memory cells 322 and 323, data memory cells 324, 325, 326, 327, 328, 329, 330, 331, 332, 333 and 334, dummy memory cells 335 and 336, and SGD transistors 337 and 338.

NAND string 320n includes SGS transistors 340 and 341, dummy memory cells 342 and 343, data memory cells 344, 345, 346, 347, 348, 349, 350, 351, 352, 353 and 354, dummy memory cells 355 and 356, and SGD transistors 357 and 358.

NAND string 330n includes SGS transistors 360 and 361, dummy memory cells 362 and 363, data memory cells 364, 365, 366, 367, 368, 369, 370, 371, 372, 373 and 374, dummy memory cells 375 and 376, and SGD transistors 377 and 378.

See also the example NAND strings of FIG. 17E.

Figure 3A:
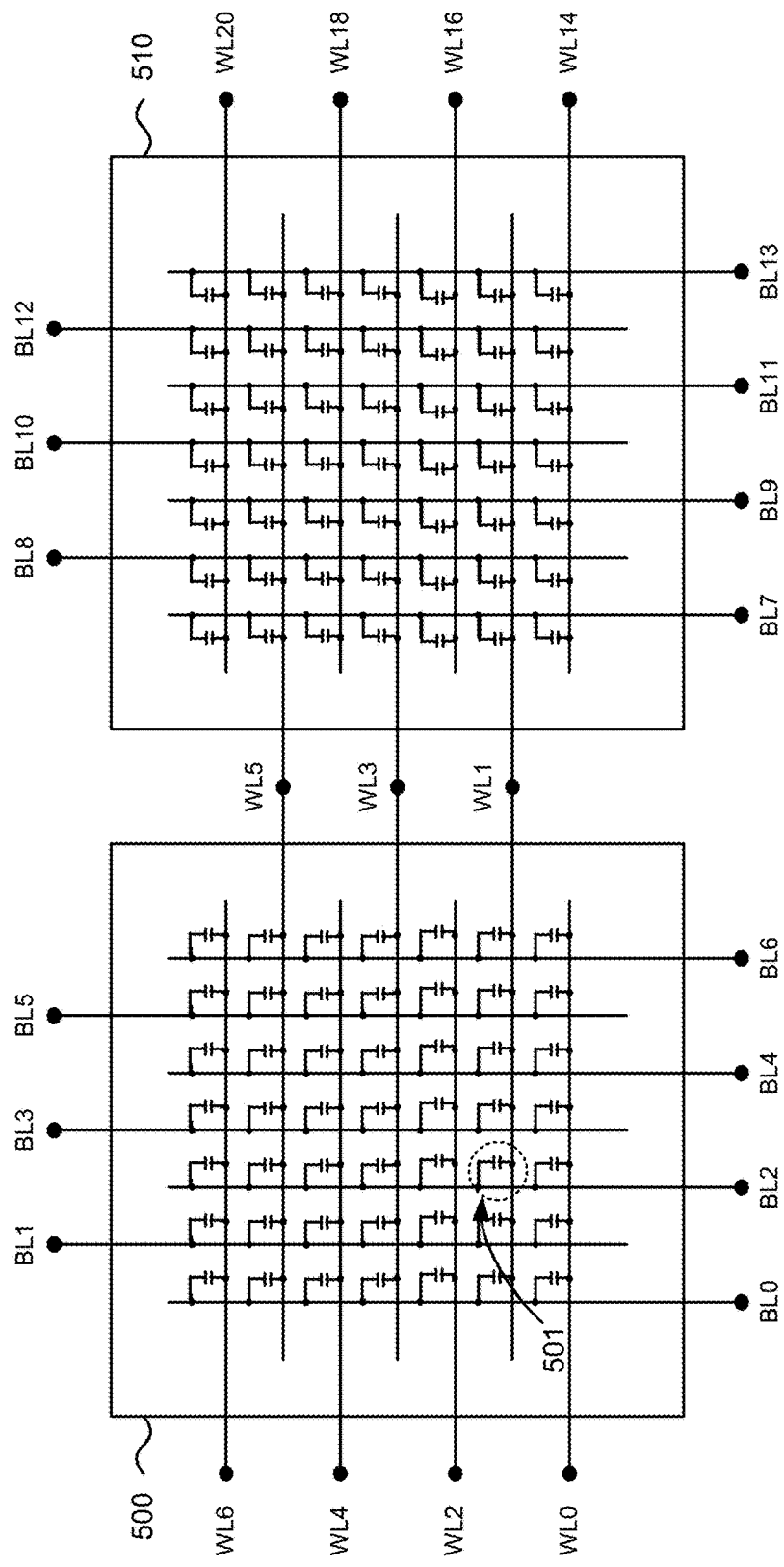
FIG. 3A depicts an example implementation of the memory structure 126 of FIG. 1 comprising memory cells in a cross-point configuration.

FIG. 3A depicts an example implementation of the memory structure 126 of FIG. 1 comprising memory cells in a cross-point configuration. As depicted, word lines WL1, WL3, and WL5 are shared between memory arrays 500 and 510 and controlled by a row decoder. Word lines WL0, WL2, WL4, and WL6 are driven from the left side of memory array 500 and controlled by a row decoder. Word lines WL14, WL16, WL18, and WL20 are driven from the right side of the memory array 510 and controlled by a row decoder. Bit lines BL0, BL2, BL4, and BL6 are driven from the bottom of memory array 500 and controlled by a column decoder. Bit lines BL1, BL3, and BL5 are driven from the top of memory array 500 and controlled by a column decoder.

In one embodiment, the memory arrays 500 and 510 may comprise memory layers that are oriented in a horizontal plane that is horizontal to the supporting substrate. In another embodiment, the memory arrays 500 and 510 may comprise memory layers that are oriented in a vertical plane that is vertical with respect to the supporting substrate (i.e., the vertical plane is perpendicular to the supporting substrate). In this case, the bit lines of the memory arrays may comprise vertical bit lines.

A memory cell is located at the intersection of each word line and bit line. For example, a memory cell 501, depicted by a capacitance to denote a capacitance switching memory cell, is at the intersection of WL0 and BL0.

Figure 3B:
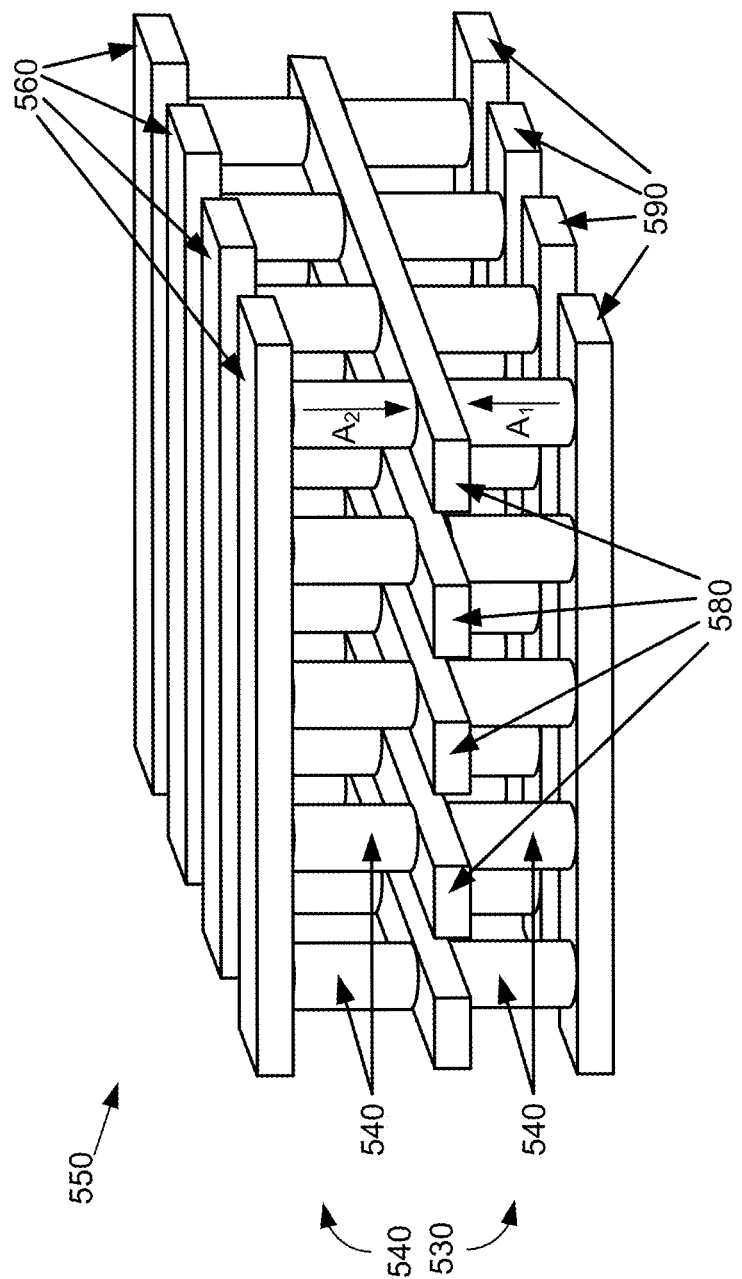
FIG. 3B depicts an example implementation of the memory structure 126 of FIG. 1 comprising a monolithic three-dimensional memory array 550 that includes a second memory level 540 positioned above a first memory level 530.

FIG. 3B depicts an example implementation of the memory structure 126 of FIG. 1 comprising a monolithic three-dimensional memory array 550 that includes a second memory level 540 positioned above a first memory level 530. The bit lines 590 and 560 are arranged in a first direction and the word lines 580 are arranged in a second direction perpendicular to the first direction. As depicted, the upper conductors of first memory level 530 may be used as the lower conductors of the second memory level 540 that is positioned above the first memory level. In a memory array with additional layers of memory cells, there would be corresponding additional layers of bit lines and word lines.

The memory array 550 includes a plurality of memory cells 570. The memory cells 570 may include re-writeable memory cells. The memory cells 570 may include non-volatile memory cells or volatile memory cells. With respect to first memory level 530, a first portion of memory cells 570 are between and connect to bit lines 590 and word lines 580. With respect to second memory level 540, a second portion of memory cells 570 are between and connect to bit lines 560 and word lines 580. In one embodiment, each memory cell includes a steering element (e.g., a diode) and a memory element (i.e., a state change element). In one example, the diodes of the first memory level 530 may be upward pointing diodes as indicated by arrow A1 (e.g., with p regions at the bottom of the diodes), while the diodes of the second memory level 540 may be downward pointing diodes as indicated by arrow A2 (e.g., with n regions at the bottom of the diodes), or vice versa. In another embodiment, each memory cell includes a state change element and does not include a steering element. The absence of a diode (or other steering element) from a memory cell may reduce the process complexity and costs associated with manufacturing a memory array.

In one embodiment, the memory cells 570 may comprise re-writable non-volatile memory cells including a capacitance switching element such as a three-state ferroelectric cell as described herein.

Figure 4A:
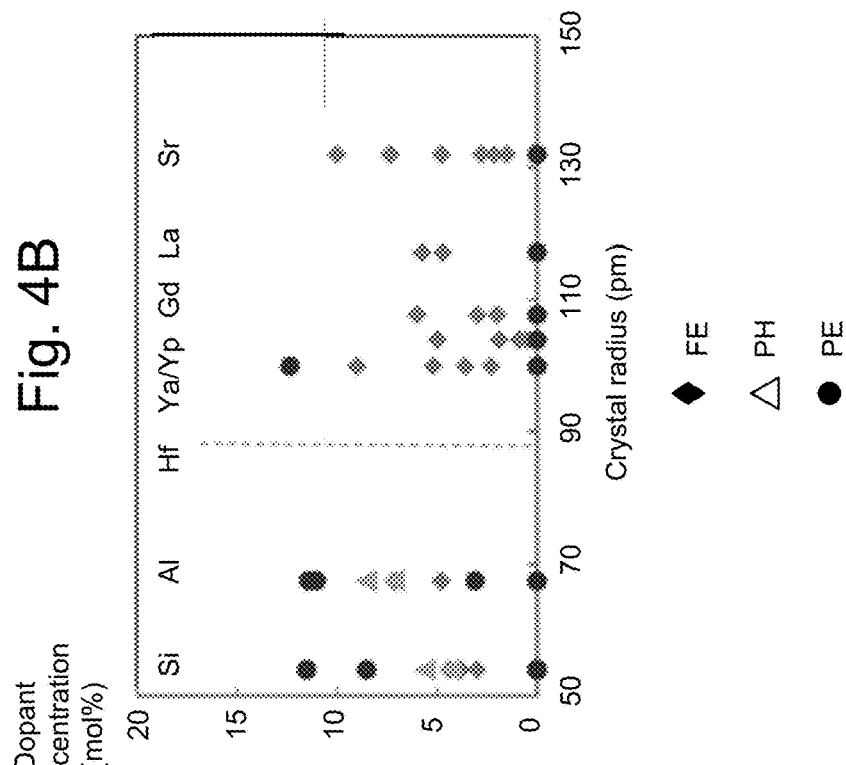
FIG. 4A depicts a plot of dopant concentration versus atomic radius for different dopants in HfO2.

FIG. 4A depicts a plot of dopant concentration (in units of mol %) versus atomic radius (in units of picometers or pm) for different dopants in hafnium oxide (HfO2). A source of this plot is U. Schroeder et al., ECS J. Solid State Science and Technology, (2013). The plot depicts a dopant concentration for the formation of the ferroelectric (FE) and anti-ferroelectric (AFE) phase in doped HfO2 layers. For pure HfO2 and highly doped HfO2 layers, a paraelectric (PE) polarization is exhibited (see FIG. 9C). Further, as the dopant concentration changes, the polarization behavior changes. For example, the diamonds represent a FE polarization (see FIGS. 7B, 9A and 9B), the triangles represent an AFE polarization and the circles represent a PE polarization.

One example of a ferroelectric material is HfO2 doped with silicon (Si), aluminum (Al), Yttrium (Y) or gadolinium (Gd). These dopant atoms have an atomic radius (r) ranging from about 40% smaller than the atomic radius of Hf at r=158 pm (examples are Al at r=125 pm and Si at r=111 pm) to about 15% larger than the atomic radius of HfO2 (examples are Y with r=180 pm and Gd with r=188 pm). HfO2 doped with any one or more of these dopant exhibits a ferroelectric behavior in a layer with a thickness as small as 6 nm. HfO2 doped with zirconium (Zr) also exhibits a FE behavior.

Figure 4B:
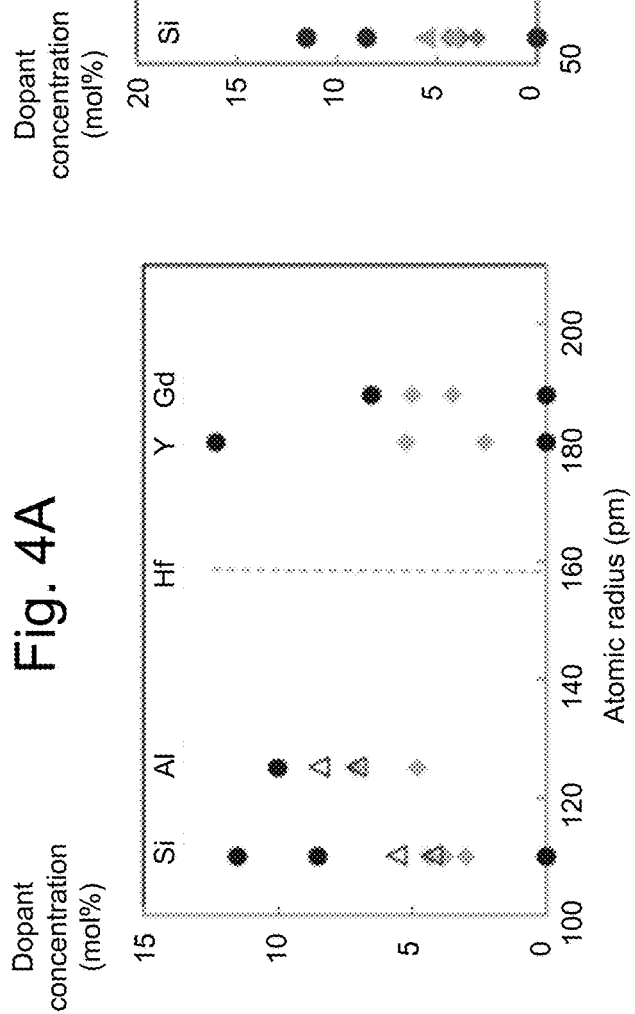
FIG. 4B depicts a plot of dopant concentration versus crystal radius for different dopants in HfO2.

FIG. 4B depicts a plot of dopant concentration (in mol %) versus crystal radius (in pm) for different dopants in HfO2. A source of this plot is U. Schroeder et al., ECS J. Solid State Science and Technology, (2013). The plot depicts dopant concentrations for the formation of different hysteresis shapes in doped HfO2 layers as a function of the crystal radius of the dopant. For pure HfO2 and highly doped HfO2 layers, a PE polarization is exhibited. Ya denotes Yttrium oxide ($Y_2O_3$) deposited by atomic layer deposition (ALD) and Yp denotes $Y_2O_3$ deposited by physical vapor deposition (PVD). Data is provided for the dopants mentioned in 4A in addition to lanthanum (La) and strontium (Sr). The diamonds represent a FE polarization after cycling, the triangles represent a pinched hysteresis and the circles represent a PE polarization.

Referring to FIGS. 4A and 4B, the doping levels which results in FE polarization are useful in providing FE layers in a three-state device as described herein. These include a dopant of Si at 3-4 mol %, a dopant of Al at 4-7 mol %, a dopant of Y at 2-5 mol % (including a dopant of Ya at 2-5 mol % or a dopant of Yp at 1-5 mol %), a dopant of Gd at 2-6 mol % (or 4-5 mol %), a dopant of La at 5-6 mol % and a dopant of Sr at 2-10 mol %.

Figure 4C:
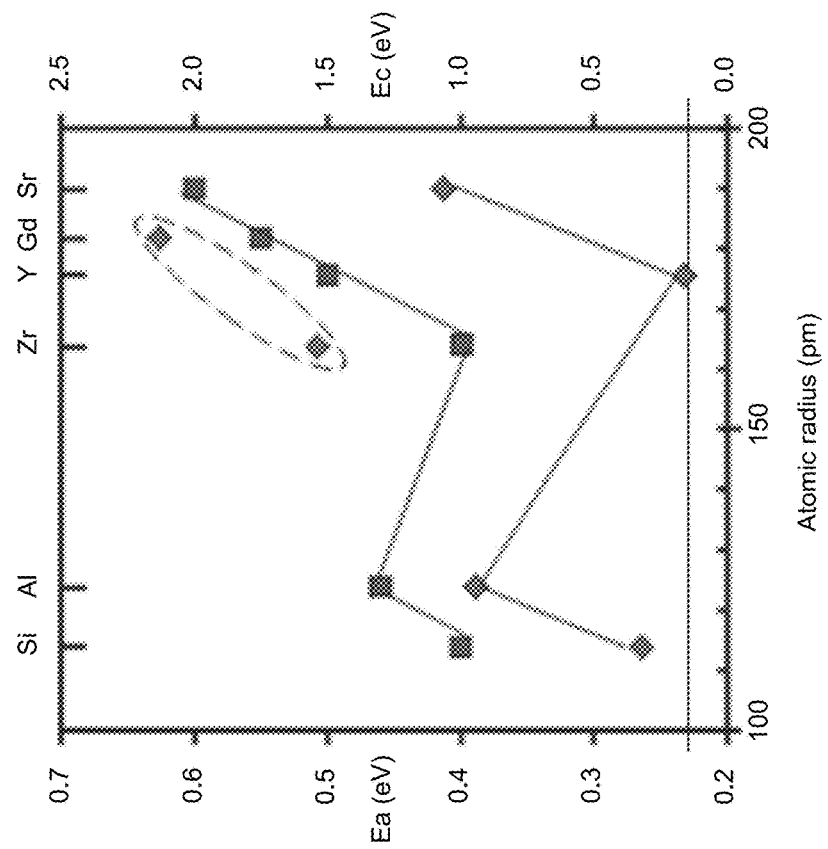
FIG. 4C depicts a plot of activation electric field (Ea) and coercive electric field (Ec) versus atomic radius for different dopants in HfO2.

FIG. 4C depicts a plot of activation electric field (Ea) and coercive electric field (Ec) versus atomic radius (unit of pm) for different dopants in HfO2, including Si, Al, Zr, Y, Gd and Sr. A source of this plot is U. Schroeder et al., Jpn. J. Appl. Phys. (2014). The left and right vertical axes are in units of eV. The plot shows that activation energy correlates with the experimental intrinsic coercive fields. Further, the dopants modulate the cell dimension without directly modulating the polarization. The coercive electric field represents the voltage needed to reverse the polarization in a ferroelectric layer.

Figure 5A:
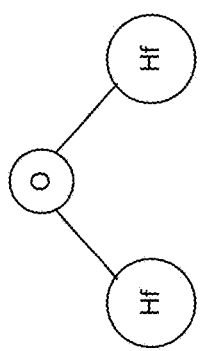
FIG. 5A depicts an oxygen atom in an up or positive polarized position relative to a pair of Hafnium atoms.

FIG. 5A depicts an oxygen atom in an up or positive polarized position relative to a pair of Hafnium atoms. A dielectric material can be polarized by an applied electric field such as between two plates of a capacitor. Polar molecules of the dielectric will move to orient themselves in the direction of the field. Some materials exhibit polarization even when no field is applied. One example is HfO2 in the orthorhombic phase, referred to as o-HfO2. Other phases such as amorphous, monoclinic and cubic do not provide polarization. o-HfO2 can be obtained by depositing amorphous HfO2 and annealing in a temperature range of 550 to 850 degrees C. In o-HfO2, the position of the oxygen atom relative to a pair of hafnium atoms denotes the polarization direction. When the oxygen atom is above the hafnium atoms, the polarization is positive or up. When the oxygen atom is below the hafnium atoms, the polarization is negative or down (FIG. 5C). When the oxygen atom is even with the hafnium atoms, the polarization is neutral (FIG. 5B).

Figure 5B:
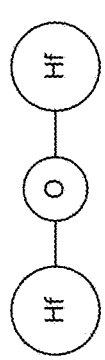
FIG. 5B depicts an oxygen atom in a neutral, non-polarized position relative to a pair of Hafnium atoms.
Figure 5C:
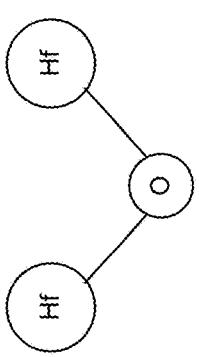
FIG. 5C depicts an oxygen atom in a down or negative polarized position relative to a pair of Hafnium atoms.

Generally, the polarizable material may comprise a metal oxide such as at least one of hafnium oxide or zirconium oxide in an orthorhombic crystalline state FIG. 5B depicts an oxygen atom in a neutral, non-polarized position relative to a pair of Hafnium atoms. The oxygen atom is even with the hafnium atoms in a centro-symmetric position.

FIG. 5C depicts an oxygen atom in a down or negative polarized position relative to a pair of Hafnium atoms. As mentioned, the oxygen atom is below the hafnium atoms.

Figure 6:
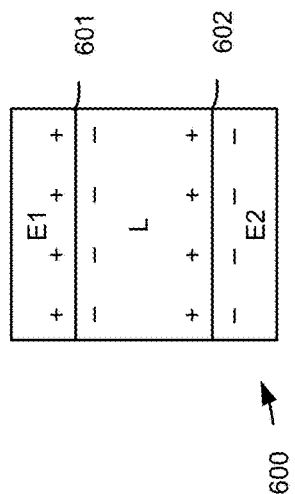
FIG. 6 depicts an example structure comprising a ferroelectric layer L between electrodes E1 and E2 in the positive polarized state consistent with FIG. 5A.

FIG. 6 depicts an example structure 600 comprising a ferroelectric layer L between electrodes E1 and E2 in the positive polarized state consistent with FIG. 5A. Generally, polarization in a non-centrosymmetric lattice induces a non-centrosymmetric charge distribution. For the structure with an external contact, at a 0 V bias, a compensating charge (of the opposite charge type) exists at the contact interface so that there is no net charge flow (current). Specifically, the movement of negative charges in L toward the interface 601 between E1 and L causes a compensating charge in the form of positive charges in E1 which also move toward the interface 601. Similarly, the movement of positive charges in L toward the interface 602 between E2 and L causes a compensating charge in the form of negative charges in E2 which also move toward the interface 602.

Figure 7B:
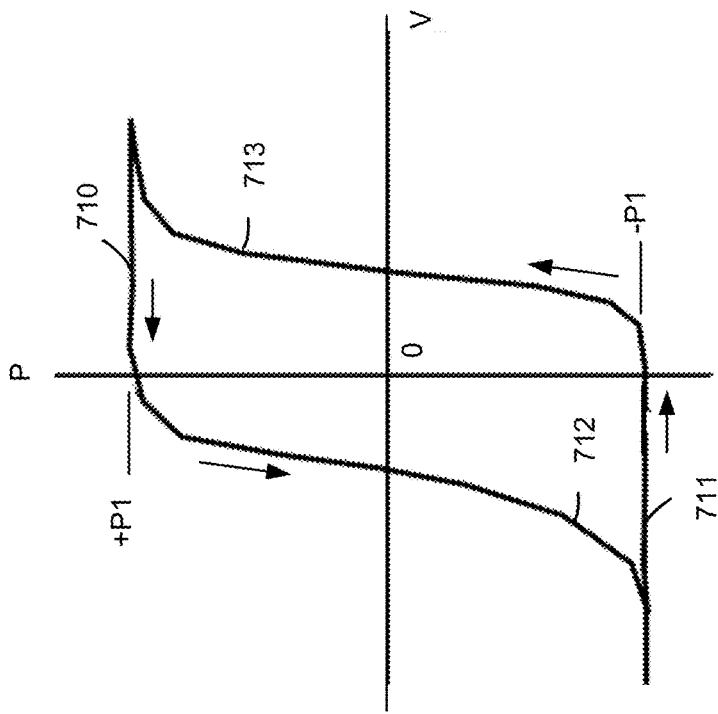
FIG. 7B depicts an example polarization-voltage diagram for the structure of FIG. 7A.
Figure 7A:
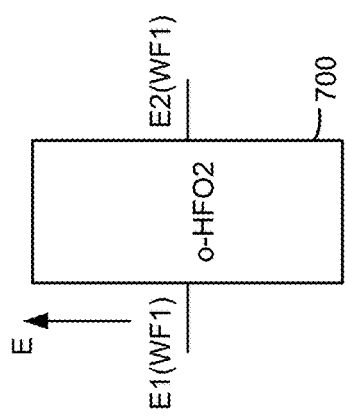
FIG. 7A depicts an example energy band diagram for the structure of FIG. 6 when E1 and E2 have equal work functions and the layer is ferroelectric (FE) o-HfO2.

FIG. 7A depicts an example energy band diagram for the structure of FIG. 6 when E1 and E2 have equal work functions and the layer is ferroelectric (FE) o-HfO2. The vertical height of the plot 700 denotes an energy level of the ferroelectric material. A first electrode E1 having a work function WF1 is at one side of the ferroelectric material and a second electrode E2 having the same work function WF1 is at another side of the ferroelectric material. Since the work functions are the same and there is no bias across the electrodes, the plot is flat at the top. This indicates the energy level is the same at the interface between E1 and FE and between E2 and FE. The structure is configured as a capacitor such as in a metal-insulator-metal (MIM) or metal-insulator-silicon (MIS) configuration.

FIG. 7B depicts an example polarization-voltage diagram or loop for the structure of FIG. 7A. The horizontal axis depicts voltage across the structure and the vertical axis depicts polarization, e.g., in units of C/cm2 (coulombs per square centimeter). The plot 710 represents the positive polarization state +P1 (the up configuration of FIG. 5A) and the plot 711 represents the negative polarization state −P1 (the down configuration of FIG. 5C). Additionally, the arrows represent possible transitions. Starting from a 0 V bias, a transition from +P1 to −P1 (plot 712) is achieved by applying a negative bias across the structure. Or, a transition from −P1 to +P1 (plot 713) is achieved by applying a positive bias across the structure. In this example, with 0 V bias across the structure (from E1 to E2), a non-volatile positive or negative polarization exists so that two states or one bit of data can be stored.

Figure 7C:
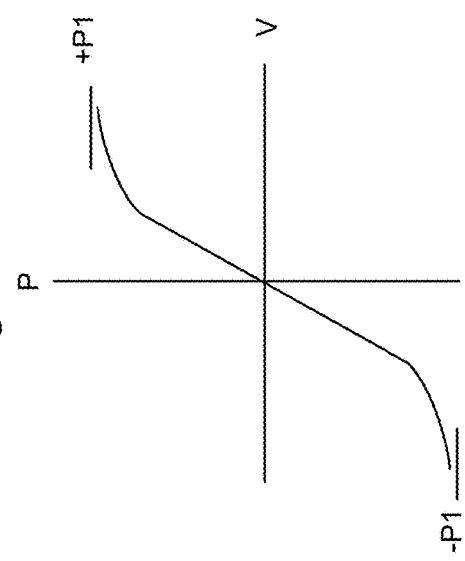
FIG. 7C depicts an example polarization-voltage diagram of a paraelectric (PE) material.

FIG. 7C depicts an example polarization-voltage diagram of a paraelectric (PE) material. A PE material has the property of nonlinear polarization with voltage. Positive and negative polarization states are provided with positive and negative biases, respectively. A bias of 0 V results in no polarization but this cannot be relied on as a stable data state because it does not exist over a range of biases.

Figure 8B:
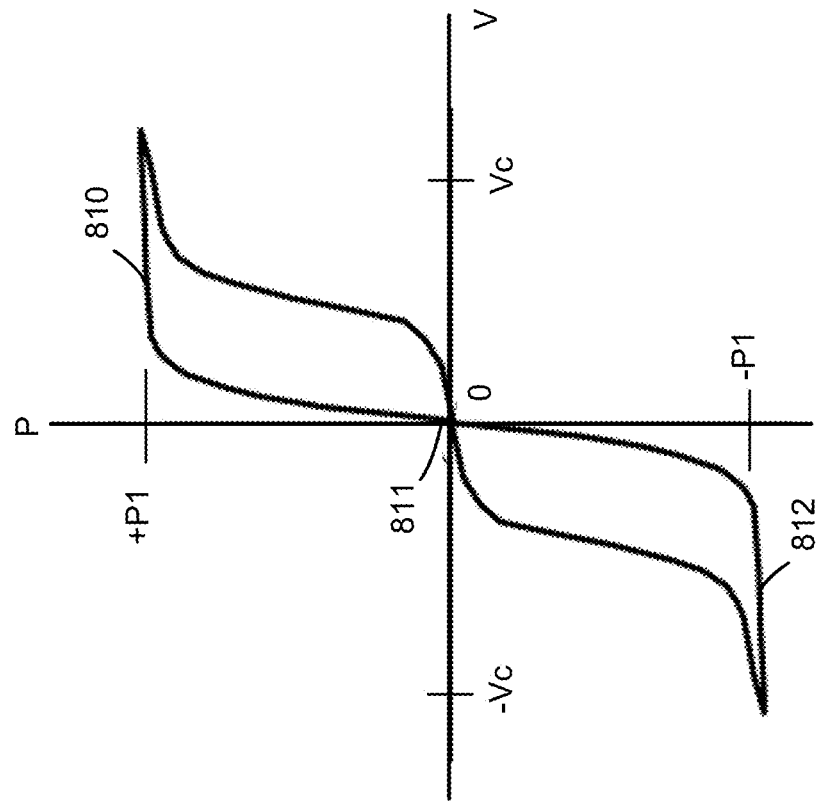
FIG. 8B depicts an example polarization-voltage diagram for the structure of FIG. 8A.
Figure 8A:
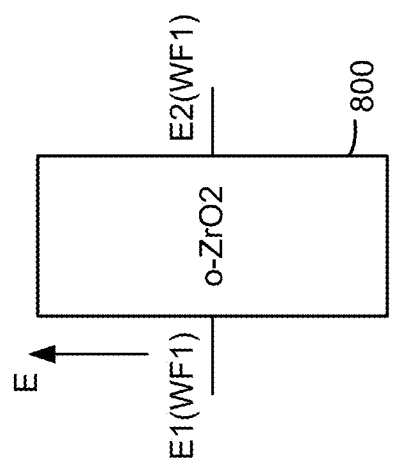
FIG. 8A depicts an example energy band diagram for the structure of FIG. 6 when E1 and E2 have equal work functions and the layer is anti-ferroelectric (FE) o-ZrO2.

FIG. 8A depicts an example energy band diagram for the structure of FIG. 6 when E1 and E2 have equal work functions and the layer is anti-ferroelectric (AFE) o-ZrO2. As in FIG. 7A, the electrodes E1 and E2 have the same work function. Since the work functions are the same and there is no bias across the electrodes, the plot 800 is flat at the top.

FIG. 8B depicts an example polarization-voltage diagram for the structure of FIG. 8A. HfO2 or ZrO2 in the AFE phase have only up and down oxygen positions, resulting in positive or negative polarization states, respectively. The positive polarization state +P1 (plot 810) corresponds to the up position of FIG. 5A and a positive voltage of Vc, the neutral polarization state (point 811) corresponds to the neutral position of FIG. 5B, and the negative polarization state −P1 (plot 812) corresponds to the down position of FIG. 5C and a negative voltage of −Vc. Since a non-zero voltage is needed to maintain the polarization states, the structure would result in a volatile memory device. That is, when the bias is removed, the oxygen returns to the centro-symmetric position and no ferroelectricity remains.

Figure 9B:
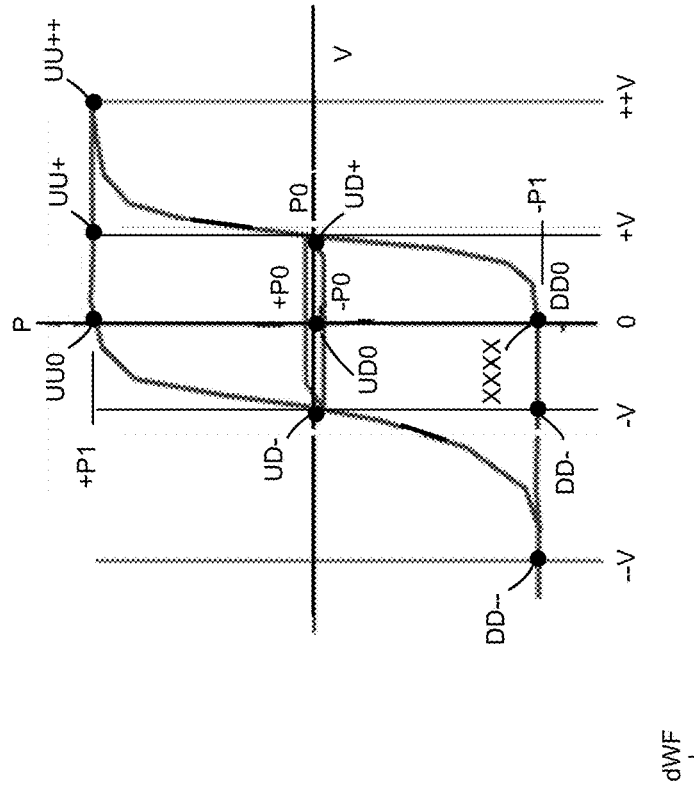
FIG. 9B depicts an example polarization-voltage diagram having three polarization levels.
Figure 9A:
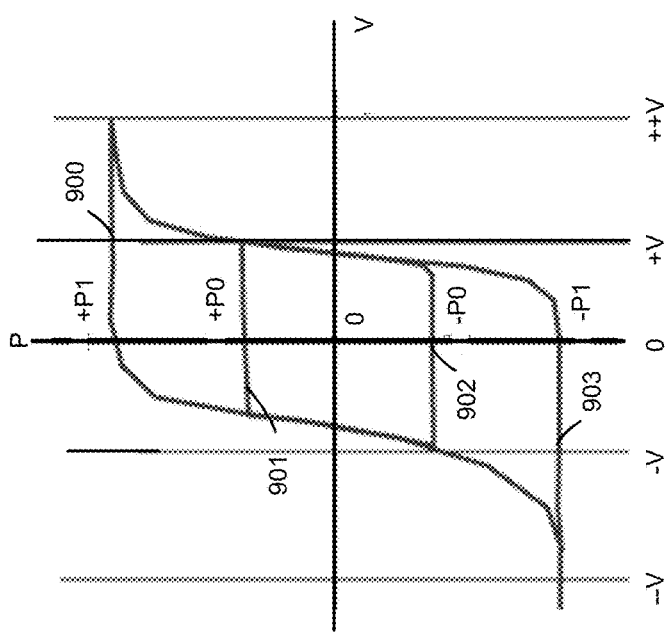
FIG. 9A depicts an example polarization-voltage diagram having four polarization levels.

FIG. 9A depicts an example polarization-voltage diagram having four polarization levels. Along the vertical polarization axis, there is a higher-magnitude positive polarization level +P1 (plot 900), a lower-magnitude positive polarization level +P0 (plot 901), a lower-magnitude negative polarization level −P0 (plot 902) and a higher-magnitude negative polarization level −P1 (plot 903). Along the horizontal bias axis, the +P1 state corresponds to a bias range from 0 to ++V, the +P0 and −P0 states correspond to a bias range from about −V to +V, and the −P1 state corresponds to a bias range from −−V to 0.

In order to achieve a multi-level (3+ level) FE memory cell, more than two polarization levels need to be maintained at zero bias. Moreover, to switch to different polarization levels in positive/negative polarities, different voltages are preferred. This provides a simpler circuit implementation for programming, where the different polarization levels correspond to different threshold voltages for a memory cell. In practices, the extra polarization levels +P0 and −P0 may have a small separation and merge into one level at a zero bias, as shown in FIG. 9B. A memory cell with three states can be considered to store 1.5 bits since two states store one bit. and one state stores a half bit FIG. 9B depicts an example polarization-voltage diagram having three polarization levels. The diagram show a positive polarization state +P1, a neutral state P0 (which combines +P0 and −P0) and a negative polarization state −P1. Additionally, three data points are shown by circles for each polarization level. For example, for +P1, UU0 is the up-up state with 0 V bias, UU+ is the up-up state with +V bias, and UU++ is the up-up state with ++V bias. The up-up state refers to a memory cell having two ferroelectric layers where both layers are in the up or positive polarization state. Thus, each ferroelectric layer can have a polarization and a memory cell formed from two or more ferroelectric layers can also have a polarization, which is a net polarization.

For P0, UD− is the up-down state with −V bias, UD0 is the up-down state with 0 V bias, and UD+ is the up-down state with +V bias. The up-down state refers to a memory cell having two ferroelectric layers where one layer is in the up or positive polarization state and another layer is in the down or negative polarization state.

For −P1, DD−− is the down-down state with −−V bias, DD− is the down-down state with −V bias, and DD0 is the down-down state with 0 V bias. The down-down state refers to a memory cell having two ferroelectric layers where both layers are in the down or negative polarization state.

Various transitions between the states are discussed further below and can be achieved in a programming operation.

dWF is usually 0.5 V to 0.7 V. Vc is the coercive voltage of the ferroelectric material, which is fixed as the coercive field and is usually fixed for one particular ferroelectric material. With o-HfO2 as an example, the coercive field is typically 1 MV/cm. For an 8 nm physical thickness, the intrinsic Vc will be ~8 V. Practically, due to dielectric leakage and the polycrystalline nature of the film, the Vc may be in the range of 5 V to 8 V. With dWF of 0.5 V and Vc of 5 V, and referring to the voltage magnitude, we have |−−V|>2×5−0.5 or |−−V|>9.5 V, |−V|=2×(5−0.5) or |−V|=9 V, +V=2×5=10 V, and ++V >2×5+0.5 or ++V>10.5 V.

Figure 10A:
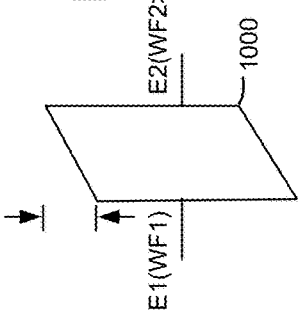
FIG. 10A depicts an example energy band diagram for the structure of FIG. 6 when the work function WF1 of E1 is lower than the work function WF2 of E2.

FIG. 10A depicts an example energy band diagram for the structure of FIG. 6 when the work function WF1 of E1 is lower than the work function WF2 of E2. dWF is the difference in the work functions of E1 and E2. Specifically, E2 has a work function of WF2 which is greater than the work function WF1 of E1. The higher work function raises the energy level of the interface of the ferroelectric material with E2, compared to the energy level of the interface of the ferroelectric material with E1, by the amount dWF. dWF should be less than Vc by a margin. For example, dWf may be 0.4-0.6 eV and Vc may be 5 V for HfO2 film with a thickness of 8 nm. Vc is the coercive voltage needed to reverse the polarization in a ferroelectric layer. Vc increases with decreasing film thickness. The unit of eV for WF is essentially comparable to the unit of V in this context.

The dWF should be smaller than Vc so that, even with the dWF, the cell does not switch by itself when a 0 V external bias is applied. The larger the margin between dWF and Vc, the better the state retention. Due to the dWF, one of the states is always intrinsically biased towards the switching polarity and the retention may degrade.

Example materials for the lower work function electrode include doped Si which can be doped n or p type and tuned over a wide range of conductivity. Titanium nitride (TiN) with WF ~4.5 eV or 4.2-4.7 eV, and tantalum nitride (TaNi) with WF ~3.9-4.4 are also options. Example materials for the higher work function electrode include Ru with WF=~5.1 eV and RuO2. Ni with WF ~5.1 eV could be used but tends to diffuse into the ferroelectric layers. NiSi is another option. Various other options are possible as well. For example, materials that are compatible with CMOS processing techniques include Cobalt (Co) with a WF of ~5 eV and similar properties with respect to Nickel (Ni). A Co-based silicide can also be used. Other materials which may be used include Noble metals such as Platinum (Pt), Gold (Au) and Iridium (Ir) which are not as easy to process using CMOS techniques.

FIG. 10B is an example sequence of energy band diagrams for a memory cell having two polarizable layers and three polarization states consistent with FIG. 9B, where the cell is initially in an up-up or positive polarization state with a bias of 0 V (plot 1000), and remains at the up-up state when biased with a relatively weak positive voltage +V (plot 1001) and then a relatively strong positive voltage of ++V (plot 1002). L1 and L2 are first and second ferroelectric layers, respectively. E1, E2 and E3 are first, second and third electrodes, respectively. In FIG. 10B to 10D, E1 and E2 have a relatively lower work function WF1 and E3 has a relatively higher work function WF2. The memory cell can be provided in a MIM or MIS configuration, for example.

FIG. 10C is an example sequence of energy band diagrams for a memory cell having two polarizable layers and three polarization states consistent with FIG. 9B, where the cell is initially in an up-down or neutral polarization state with a bias of 0 V (plot 1010), remains at the up-down state when biased with +V (plot 1011) and then transitions to the up-up state when biased with ++V (plot 1012).

FIG. 10D is an example sequence of energy band diagrams for a memory cell structure having two polarizable layers and three polarization states consistent with FIG. 9B, where the cell is initially at a down-down or negative polarization state with a bias of 0 V (plot 1020), transitions to the up-down state when biased with +V (plot 1021) and then transitions to the up-up state when biased with ++V (plot 1022).

FIG. 11A is an example sequence of energy band diagrams for a memory cell having two polarizable layers and three polarization states consistent with FIG. 9B, where the cell is initially in an up-up state with a bias of 0 V (plot 1100), transitions to the up-down state when biased with a relatively weak negative voltage −V (plot 1101) and then transitions to the down-down state when biased with a relatively strong negative voltage of −−V (plot 1102). In FIG. 11A to 11C, E1 and E2 have a relatively lower work function WF1 and E3 has a relatively higher work function WF2.

FIG. 11B is an example sequence of energy band diagrams for a memory cell having two polarizable layers and three polarization states consistent with FIG. 9B, where the cell is initially in an up-down state with a bias of 0 V (plot 1110), remains in the up-down state when biased with −V (plot 1111) and then transitions to the down-down state when biased with −V (plot 1112).

FIG. 11C is an example sequence of energy band diagrams for a memory cell having two polarizable layers and three polarization states consistent with FIG. 9B, where the cell is initially at a down-down state with a bias of 0 V (plot 1120), and remains in the down-down state when biased with −V (plot 1121) and then −−V (plot 1122).

FIG. 12A is an example sequence of energy band diagrams for a memory cell having two polarizable layers and three polarization states consistent with FIG. 9B, where the cell is initially at a down-down state with a bias of −−V (plot 1200), transitions to the up-down state with a bias of −V (plot 1201), then to the up-up state with a bias of 0 V (plot 1202), and then remains in the up-up state with a bias of +V (plot 1203) and then ++V (plot 1204). In FIG. 12A to 12C, E1 and E2 have a relatively lower work function WF1 and E3 has a relatively higher work function WF2.

FIG. 12B is an example sequence of energy band diagrams for a memory cell having two polarizable layers and three polarization states consistent with FIG. 9B, where the cell is initially in an up-down state with a bias of −V (plot 1210), transitions to the up-up state with a bias of 0 V (plot 1211), and then remains in the up-up state with a bias of +V (plot 1212).

FIG. 12C is an example energy band diagram for a memory cell having two polarizable layers and three polarization states consistent with FIG. 9B, where the cell is in an up-up state with a bias of 0 V (plot 1220).

FIG. 13A is an example energy band diagram for a memory cell having two polarizable layers and three polarization states consistent with FIG. 9B, where the cell has electrodes E1 and E2 with a relatively low work function WF1 and an electrode E3 with a relatively high work function WF2>WF1. The diagram includes plots 1300 and 1301 for the ferroelectric layers L1 and L2, respectively.

FIG. 13B is an example table of switching voltages consistent with FIG. 13A. Example values are: −−V >2×Vc−dWF, −V=2×(Vc−dWF), +V=2×Vc, and ++V>2×Vc+dWF. Example numerical values were provided previously.

FIG. 14A is an example energy band diagram for a memory cell having two polarizable layers and three polarization states consistent with FIG. 9B, where the cell has electrodes E1 and E3 with a relatively high work function WF2 and an electrode E2 with a relatively low work function WF1. The diagram includes plots 1400 and 1401 for the ferroelectric layers L1 and L2, respectively.

FIG. 14B is an example table of switching voltages consistent with FIG. 14A. Example values are: −−V>2×Vc−dWF, −V=2×(Vc−dWF), +V=2×(Vc−dWF) and ++V>2×Vc−dWF.

FIG. 15A is an example energy band diagram for a memory cell having two polarizable layers and three polarization states consistent with FIG. 9B, where the cell has electrodes E1 and E3 with a relatively low work function WF1 and an electrode E2 with a relatively high work function WF2. The diagram includes plots 1500 and 1501 for the ferroelectric layers L1 and L2, respectively.

FIG. 15B is an example table of switching voltages consistent with FIG. 15A. Example values are: −−V>2×Vc−dWF, −V=2×(Vc−dWF), +V=2×(Vc−dWF) and ++V>2×Vc−dWF.

FIG. 13A has asymmetric program voltages −V and +V due to the asymmetry in the energy bands of L1 and L2 (L1 is flat and L2 is higher at E3 than at E2).

FIGS. 14A and 15A have symmetric program voltages −V and +V due to the symmetry in the energy bands of L1 and L2. This can provide a simpler implementation for programming the memory cell. In all three cases, the minimum voltage separation between the voltages is dWF. The switching voltages V in FIGS. 13B, 14B and 15B are provided as magnitudes. For example, in FIG. 13B, −−V >2×Vc−dWF means the magnitude of −−V is greater than 2×Vc−dWF. −V and −−V are negative voltages. A larger dWF can be preferable to provide more operation margin. Usually Vc is much larger than dWF so there is not much concern that dWF will be too large and violate the condition that dWF should be less than Vc by a margin.

FIG. 16A depicts example energy bands of a memory cell having three polarizable layers, where a work function WF2 of the electrode E4 is greater than the word function WF1 of the electrodes E1 E2 and E2. Despite the additional ferroelectric layer compared to the two-layer configuration, this configuration results only in binary data being stored. E1, E2 and E3 have a relatively low work function WF1 and E4 has a relatively high work function WF2. L1, L2 and L3 are the three ferroelectric layers.

FIG. 16B depicts a table showing net polarization of a memory cell consistent with FIG. 16A with different polarizations of the layers. There are eight possible combinations of polarization of the layers, but the net polarization across the set of layers has only up and down binary states. For example, with L1, L2 and L3 in the up, up and up states, respectively, the net polarization is up. With L1, L2 and L3 in the up, up and down states, respectively, the net polarization is up. With L1, L2 and L3 in the up, down and down states, respectively, the net polarization is down. With L1, L2 and L3 in the up, down and up states, respectively, the net polarization is up. With L1, L2 and L3 in the down, down and down states, respectively, the net polarization is down. With L1, L2 and L3 in the down, down and up states, respectively, the net polarization is down. With L1, L2 and L3 in the down, up and up states, respectively, the net polarization is up. With L1, L2 and L3 in the down, up and down states, respectively, the net polarization is down.

The reason the net polarization is binary is as follows. For a single ferroelectric layer, Vc=t*Ec, where Vc is the coercive voltage, t is the thickness and Ec is the coercive or switching electric field for the layer. The capacitance is C=k/t, where k is the dialectic constant of the layer. An amount of charge stored across the layer is dQ=CxVc=kxEc. For one particular ferroelectric stack, the required switching electric field Ec is constant. Consequently, for the same ferroelectric stack, the total ferroelectric charge is thickness independent. By putting multiple layers together, we can achieve three states at a maximum.

In summary, by introducing an electrode work function difference and using an even number of ferroelectric layers, e.g., two, four or more, it is possible to create a three level memory cell storing 1.5 bits even though each constituent layer is binary switching. In one approach, the layers have the same composition. In other approaches, different layers have different compositions. One example uses TiN for the lower work function electrode and Ru for the higher work function electrode.

Some other approaches involve controlling grains switching in sequence. In contrast, the present approach is a top-down approach which modifies energy band alignments. The operation for multi-level memory cell involves applying different voltages and is clearly defined by analytical prediction. Moreover, the techniques are compatible with scaling down of memory cells without increasing cell-to-cell non-uniformity. Other advantages include leveraging the features of a single ferroelectric layer including fast switching, e.g., <100 ns, low voltage, e.g., Ec~2 MV/cm and Vc<=5 V, a similar reliability as conventional non-volatile memory with an endurance of more than 10^5 program-erase cycles, and use of mature fabrication processes such as ALD processing and annealing.

Another approach for a multi-level memory cell involves switching a single domain in sequence to separate up, down and neutral ferroelectric levels. A disadvantage of this approach is that when scaling of the memory cell size, the number of domains also decreases. The control of switching of each domain in sequence for a limited number of domains becomes more and more non-uniform between different cells. For example, the domain size of a Lead Zirconium Titanate (PZT) or SrBi2Ta2O9 (SBT) perovskites-based stack is in the range of ~100 nm, and thus the device scaling stops at the 0.13 um technology. In contrast, the domain size of an HfO2-based stack is in the range of ~10-30 nm. For a cell size of 12 nm×48 nm which is suitable for storage class memory, there are only a few domains and the possibility of controlling a single domain in sequence is expected to be very non-uniform.

A typical ferroelectric stack such as HfO2 doped with Al has only up and down states, with the oxygen atom moving upwards or downwards, respectively, from its original lattice plane. At zero bias, after a switching voltage is removed, the oxygen atoms maintain their up or down position to provide non-volatile binary states.

An anti-ferroelectric stack such as HfO2 doped with Zr or ZrO2 doped with Si also has only up and down states, with the oxygen atom moving upwards or downwards, respectively, from its original lattice plane. But at zero bias, after the switching voltage is removed, the oxygen atom will move back to its neutral position, and thus provide only volatile binary switching.

By using different work function electrodes (e.g., Ru with WF=~5.1 eV and TiN with WF 4.5 eV, a built-in internal electric field at zero voltage can be introduced. Moreover, by combining two FE layers, with different electrodes/WFs on each side, the net polarization of "0/neutral" can be achieved, in addition to the up and down states, resulting in three non-volatile FE levels.

The required switching voltages to achieve the up, neutral and down states are separated by dWF, and thus a voltage operation margin exists for programming the three different levels.

Moreover, the three states (up, neutral, down) corresponds to three different gate capacitances for a FeFET device (Cox+Cf, Cox, Cox −Cf), and therefore gives three different threshold voltages (Vth).

The dVth between the neutral state and the up state, and between the neutral state and the down state, is proportional to the anti-ferroelectric capacitance and may be about ~0.5-1 V with a polarization of about 15-20 uC/cm^2.

By only changing the gate metal from a mid-gap TiN to Ru (resulting in a dWF of ~0.5 eV), while keep the same ferroelectric material stack (e.g., comprising HfO2 doped with Al or ZrO2 doped with Si), controllable, three-level non-volatile switching can be achieved.

FIG. 17A depicts an example memory cell 1700 having two polarizable layers L1 and L2 and three electrodes E1, E2 and E3, in a two terminal configuration. Various materials which can be used in the layers and electrodes were discussed previously.

FIG. 17B depicts an example memory cell 1710 having two polarizable layers L1 and L2 and three electrodes E1, E2 and E3, in a three terminal configuration. The memory cell is on a substrate 1724 having diffusion regions 1721 and 1723. The memory cell includes two polarizable layers L1 and L2 and three electrodes E1, E2 and E3. Additionally, source and drain terminals 1720 and 1722, respectively, on the substrate are used to communicate with the memory cell. The electrode E1 is the third terminal and acts as a control gate for the cell.

FIG. 17C depicts an example string 1730 of memory cells 1731, 1732, 1733 and 1734 having two polarizable layers in a FeFET configuration, where the memory cells are arranged in parallel. The memory cells have a drain connected to a common bit line 1735 for sensing at a sense circuit 1736, and a source connected to ground. Each memory cell has an electrode as a control gate connected to a respective word line 1731a, 1732a, 1733a or 1734a. In the configuration of this and other figures, each memory cell is programmed with a polarization state which sets a Vth of the cell. The Vth can be read back by sensing a current on the bit line at the sense circuit while a read voltage is applied to the control gate.

FIG. 17D depicts an example string 1740 of memory cells 1741, 1742 and 1743 having two polarizable layers in a FeRAM configuration, where the memory cells are arranged in parallel. Each memory cell includes a transistor 1741b, 1742b and 1743b and a capacitor 1741c, 1742c and 1743c, respectively. The data is stored in the capacitor using the transistor to access the capacitor. The memory cells have a drain connected to a common bit line 1744 for sensing at a sense circuit 1745, and a source connected to the respective capacitor, which in turn is connected to ground. Each transistor includes a control gate connected to a respective word line 1741a, 1742a 1743a and other layers such as a gate oxide.

FIG. 17E depicts example strings 1750 and 1760 of memory cells having two polarizable layers in a FeFET configuration, where the memory cells are arranged in series in a NAND configuration. The ferroelectric layers and electrodes are separate for each memory cell. The memory string 1750 is connected to a source line 1750a at one end and to a bit line 1755 and sense circuit 1756 at another end. The memory string 1750 includes memory cells 1751, 1752, 1753 and 1754. Each memory cell is connected to a word line 1751i, 1752i, 1753i or 1754i which may be a conductive layer. The conductive layers alternate with dielectric layers 1765, 1766, 1767, 1768 and 1769 to form a stack. The memory cell 1751, for example, includes two polarizable layers 1752b and 1752d and three electrodes 1751a, 1751c and 1751e, along with a source terminal 1751g and a drain terminal 1751f The memory cell also includes a channel film 1751h in which a current may flow when the cell is in a conductive state, e.g., when its control gate voltage exceeds its Vth. The channel film may extend continuously along the length of the memory string. The memory string 1760 similarly includes memory cells 1761, 1762, 1763 and 1764. Each memory cell is connected to one of the word lines 1751i, 1752i, 1753i or 1754i.

The sense circuit may perform a sensing operation such as a read operation for a selected memory cell in the memory string. A control gate voltage at a read level is applied to the selected memory cell while a current in the string is sensed by the sense circuit. A control gate voltage at a pass voltage level is applied to the remaining, unselected memory cells to provide those cells in a conductive state. The pass voltage may be greater than the highest Vth, e.g., the Vth of the positive polarized state but lower than a program voltage which switches the polarization state. In one approach, the sense circuit compares the current in the string to two reference currents Iref1 and Iref2 while one control gate read voltage is applied. In another possible approach, the sense circuit compares the current in the string to one reference current while two control gate read voltages are applied in turn. Example read processes are discussed further below in connection with FIGS. 19A and 19B.

The memory strings may include additional components such as SGD and SGS transistors as shown in FIG. 2. These are omitted for clarity in FIG. 17B.

Figure 18A:
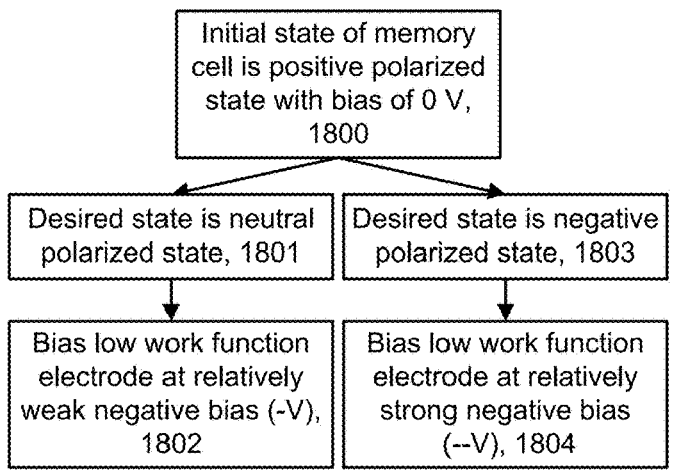
FIG. 18A depicts an example process for programming a memory cell having three polarizable states where an initial state is a positive polarized state.

FIG. 18A depicts an example process for programming a memory cell having three polarizable states where an initial state is a positive polarized state. At step 1800, the initial state of the memory cell is a positive polarized state with a bias of 0 V. In one option, at step 1801, the desired state is the neutral polarized state. Step 1802 includes biasing the lower work function electrode at a relatively weak negative bias (−V). This represents a transition from UU0 to UD− in FIG. 9B. In another option, at step 1803, the desired state is the negative polarized state. Step 1804 includes biasing the lower work function electrode at a relatively strong negative bias (−−V). This represents a transition from UU0 to DD− in FIG. 9B.

Figure 18B:
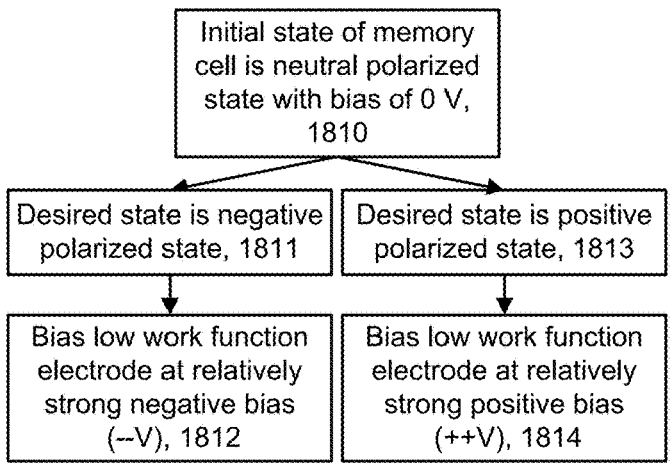
FIG. 18B depicts an example process for programming a memory cell having three polarizable states where an initial state is a neutral polarized state.

FIG. 18B depicts an example process for programming a memory cell having three polarizable states where an initial state is a neutral polarized state. At step 1810, the initial state of the memory cell is the neutral polarized state with a bias of 0 V. In one option, at step 1811, the desired state is the negative polarized state. Step 1812 includes biasing the lower work function electrode at a relatively strong negative bias (−−V). This represents a transition from UD0 to DD− in FIG. 9B. In another option, at step 1813, the desired state is the positive polarized state. Step 1814 includes biasing the lower work function electrode at a relatively strong positive bias (++V). This represents a transition from UD0 to UU++ in FIG. 9B.

Figure 18C:
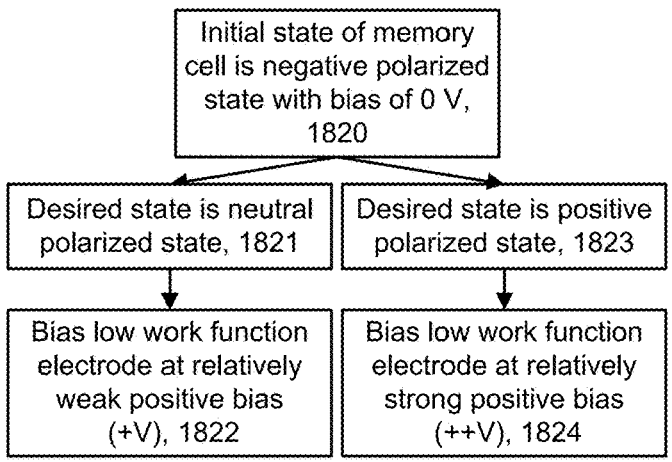
FIG. 18C depicts an example process for programming a memory cell having three polarizable states where an initial state is a negative polarized state.

FIG. 18C depicts an example process for programming a memory cell having three polarizable states where an initial state is a negative polarized state. At step 1820, the initial state of the memory cell is the negative polarized state with a bias of 0 V. In one option, at step 1821, the desired state is the neutral polarized state. Step 1822 includes biasing the lower work function electrode at a relatively weak positive bias (+V). This represents a transition from DD0 to UD+ in FIG. 9B. In another option, at step 1823, the desired state is the positive polarized state. Step 1824 includes biasing the lower work function electrode at a relatively strong positive bias (++V). This represents a transition from DD0 to UU++ in FIG. 9B.

A control circuit may be configured to perform a programming operation for a selected memory cell of a memory string, wherein to perform the programming operation, the control circuit is configured to apply a pass voltage to unselected memory cells of the memory string and a program voltage to the selected memory cell, wherein a magnitude (e.g., |−−V|, |−V|, |+V| or |++V|) and polarity (e.g., negative or positive) of the program voltage is based on a current polarization state of the selected memory cell and a desired polarization state of the selected memory cell.

Figure 19A:
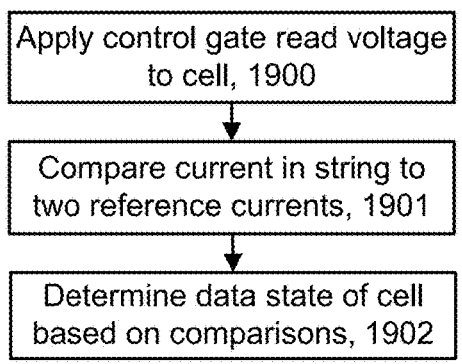
FIG. 19A depicts an example process for reading a memory cell having three polarizable states using one control gate voltage.
Figure 20A:
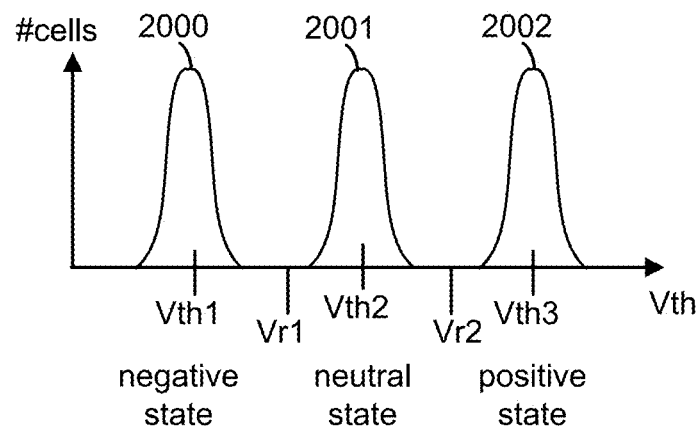
FIG. 20A depicts an example threshold distribution of a three-state memory cell.

FIG. 19A depicts an example process for reading a memory cell having three polarizable states using one control gate voltage. Step 1900 includes applying a control gate read voltage to a cell. Step 1901 includes comparing a current in the string (or cell) to two reference currents, e.g., Iref1 and Iref2 as in FIG. 17E. Step 1902 includes determining a data state of the cell based on the comparisons. For example, FIG. 20A shows the Vth levels of three data states. During sensing, the current in a string will be relatively high when the control gate read voltage exceeds the Vth of the cell. The Vth and the corresponding state among three states can be determined by comparing the current to two reference currents, e.g., a lower current Iref1 and a higher current Iref2. If the sensed current exceeds Iref1 and Iref2, the cell is in the negative polarized state. If the sensed current exceeds neither Iref1 not Iref2, the cell is in the positive polarized state. If the sensed current exceeds Iref1 but not Iref2, the cell is in the neutral state.

Figure 19B:
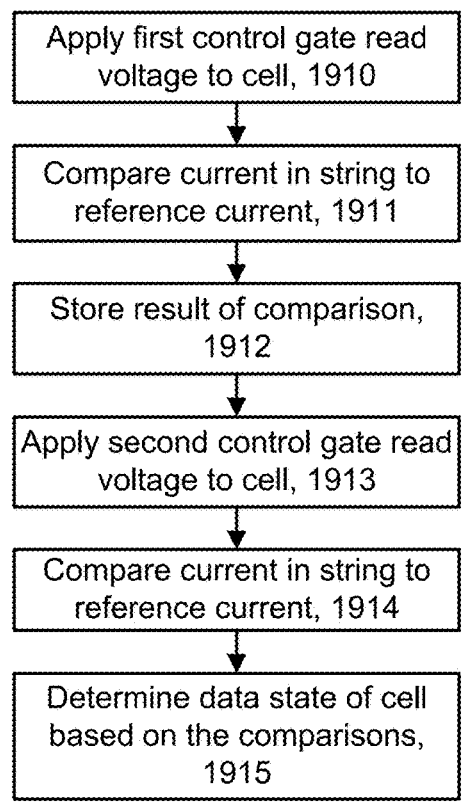
FIG. 19B depicts an example process for reading a memory cell having three polarizable states using two control gate voltages.

FIG. 19B depicts an example process for reading a memory cell having three polarizable states using two control gate voltages. Step 1910 includes applying a first control gate read voltage to a cell, such as Vr1 in FIG. 20. Step 1911 includes comparing a current in the string (or cell) to a reference current. Step 1912 includes storing a result of the comparison, e.g., whether the sense current exceeds or does not exceed the reference current. Step 1913 includes applying a second control gate read voltage to a cell, such as Vr2 in FIG. 20. Step 1914 includes comparing a current in the string (or cell) to the reference current. Step 1915 includes determining a data state of the cell based on the comparisons.

A control circuit may be configured to perform a read operation for a selected memory cell of a memory string, wherein to perform the read operation, the control circuit is configured to apply a pass voltage to unselected memory cells of the memory string and a read voltage to the selected memory cell, and sense a polarization state of the selected memory cell based on a comparison of a current in the memory string to at least two reference currents.

FIG. 20A depicts an example threshold distribution of a three-state memory cell. The vertical axis depicts a number of cells and the horizontal axis depicts a Vth which is based on the capacitance of the cell. The distribution includes plots 2000, 2001 and 2002 which represent the negative polarized state, the neutral state and the positive polarized state, respectively. Control gate read voltages Vr1 and Vr2 are also depicted. In one implementation, the at least three different threshold voltages Vth1, Vth2 and Vth3, taken at the center of each distribution, are separated by at least 0.3 V. For example, Vth2−Vth1>=0.3 V and Vt3−Vth2>=0.3 V. This provides a good separation which allows the different data states to be easily distinguished.

Figure 20B:
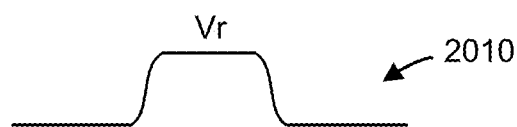
FIG. 20B depicts an example read voltage consistent with step 1900 of FIG. 19A.

FIG. 20B depicts an example read voltage consistent with step 1900 of FIG. 19A. The plot 2010 depicts a single voltage at a level of Vr which may be used in the process of FIG. 19A.

Figure 20C:
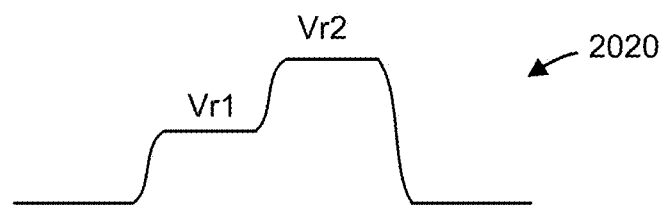
FIG. 20C depicts example read voltages consistent with steps 1910 and 1913 of FIG. 19B.

FIG. 20C depicts example read voltages consistent with steps 1910 and 1913 of FIG. 19B. The plot 2020 depicts voltages at Vr1 and Vr2, consistent with FIG. 20A, which may be used in the process of FIG. 19B.

Figure 21:
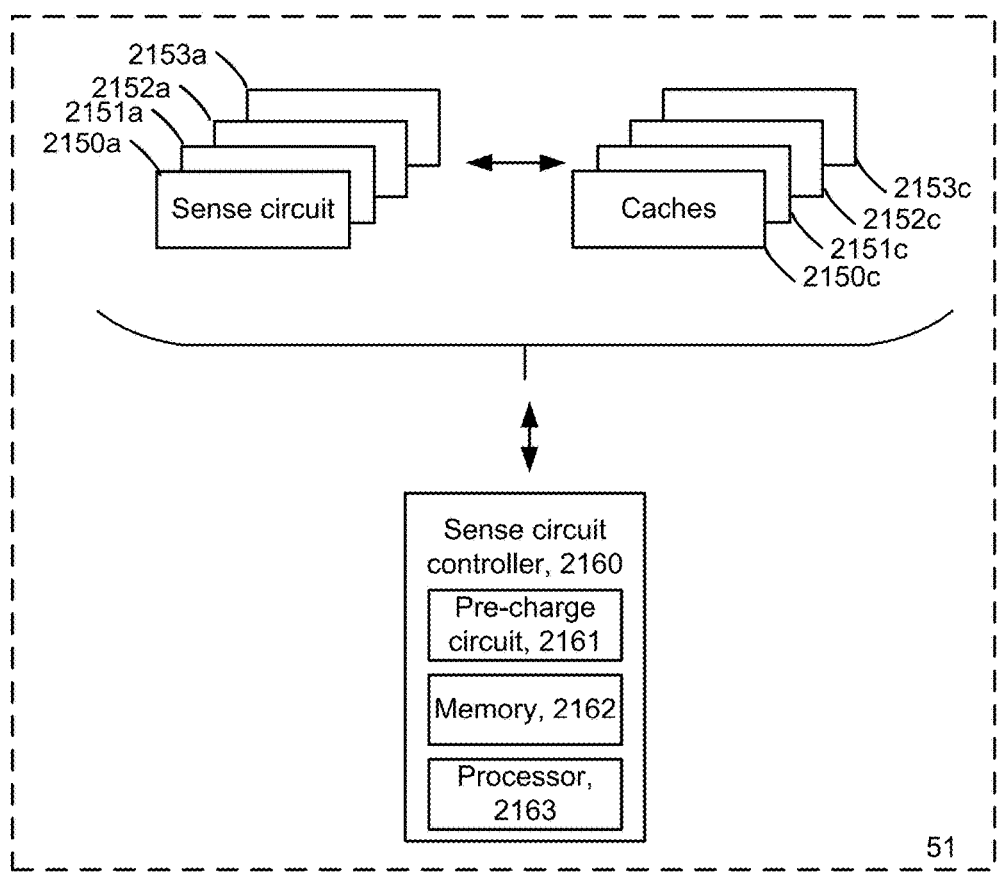
FIG. 21 depicts an example block diagram of a sense block 51 in the column control circuitry of FIG. 1.

FIG. 21 depicts an example block diagram of a sense block 51 in the column control circuitry of FIG. 1. The column control circuitry can include multiple sense blocks, where each sense block performs sensing, e.g., read, program verify or erase verify operations for multiple memory cells via respective bit lines.

In one approach, a sense block comprises multiple sense circuits, also referred to as sense amplifiers. These may represent the sense circuits 1736, 1745, 1756 and 1770 discussed in connection with FIG. 17C-17E, for example. Each sense circuit is associated with data latches and caches. For example, the example sense circuits 2150a, 2151a, 2152a and 2153a are associated with caches 2150c, 2151c, 2152c and 2153c, respectively. The sense circuits are used in writing data to, and reading data from, the primary and auxiliary pages as discussed herein.

In one approach, different subsets of bit lines can be sensed using different respective sense blocks. This allows the processing load which is associated with the sense circuits to be divided up and handled by a respective processor in each sense block. For example, a sense circuit controller 2160 can communicate with the set, e.g., sixteen, of sense circuits and latches. The sense circuit controller may include a pre-charge circuit 2161 which provides a voltage to each sense circuit for setting a pre-charge voltage. The sense circuit controller may also include a memory 2162 and a processor 2163.

Figure 22:
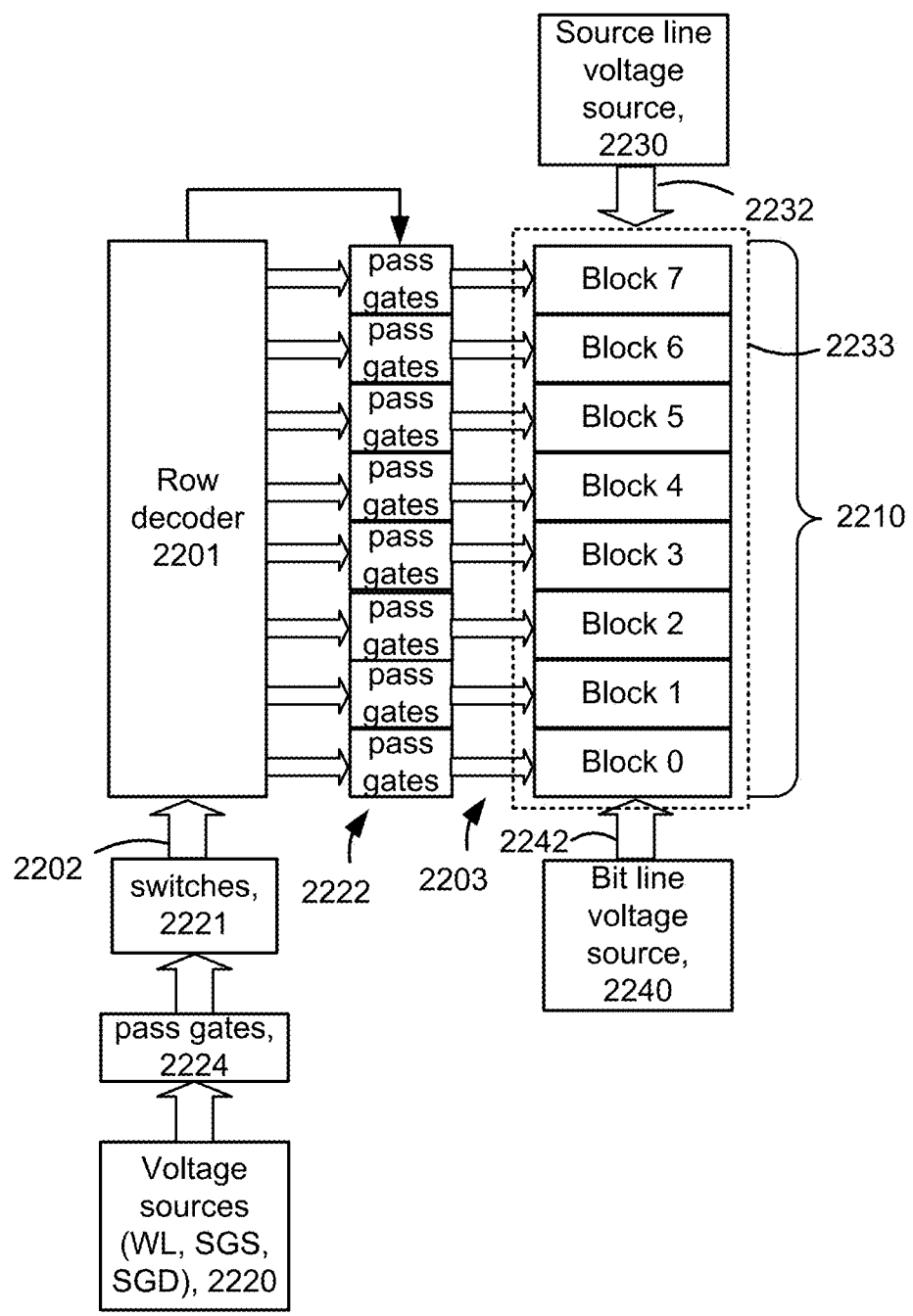
FIG. 22 depicts an example circuit for providing voltages to blocks of memory cells.

FIG. 22 depicts an example circuit for providing voltages to blocks of memory cells. In this example, a row decoder 2201 provides voltages to word lines and select gates of each block in set of blocks 2210. The set could be in a plane and includes blocks 0-7. The row decoder provides a control signal to pass gates 2222 which connect the blocks to the row decoder. Typically, operations, e.g., program, read or erase, are performed on one selected block at a time. The row decoder can connect global control lines 2202 to local control lines 2203. The control lines represent conductive paths. Voltages are provided on the global control lines from voltage sources 2220. The voltage sources may provide voltages to switches 2221 which connect to the global control lines. Pass gates 2224, also referred to as pass transistors or transfer transistors, are controlled to pass voltages from the voltage sources 2220 to the switches 2221.

The voltage sources 2220 can provided voltages on word lines (WL), SGS control gates and SGD control gates, for example.

The various components, including the row decoder, may receive commands from a controller such as the state machine 112 or the controller 122 to perform the functions described herein.

A source line voltage source 2230 provides a voltage to the source lines/diffusion region in the substrate via control lines 2232. In one approach, the source diffusion region 2233 is common to the blocks. A set of bit lines 2242 is also shared by the blocks. A bit line voltage source 2240 provides voltages to the bit lines. In one possible implementation, the voltage sources 2220 are near the bit line voltage source.

In one embodiment, a memory cell comprises: a first ferroelectric layer between a first electrode and a second electrode; and a second ferroelectric layer between the second electrode and a third electrode, wherein at least two of the electrodes have different work functions which are different by at least 0.4 V.

In one embodiment, a memory device comprises a plurality of memory cells connected in series in a memory string, the memory string extending vertically, each memory cell polarizable in at least three polarization states and comprising a first ferroelectric layer between a first electrode and a second electrode, and a second ferroelectric layer between the second electrode and a third electrode, wherein at least two of the electrodes have different work functions which are different by at least 0.4 V and at least two of the electrodes have work functions which are equal within a tolerance of +/−0.1 V; conductive layers connected to the memory cells; and dielectric layers alternating with the conductive layers.

In another embodiment, a method for switching a memory cell comprises: providing the memory cell in a first polarized state, wherein the memory cell comprises a first ferroelectric layer between a first electrode and a second electrode, and a second ferroelectric layer between the second electrode and a third electrode, at least two of the electrodes have different work functions, and the memory cell is polarizable in at least three polarized states; providing a first bias across the memory cell which switches the memory cell from the first polarized state to a second polarized state; and providing a second bias across the memory cell which switches the memory cell from the second polarized state to a third polarized state.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A memory cell, comprising:
a first ferroelectric layer between a first electrode and a second electrode; and
a second ferroelectric layer between the second electrode and a third electrode, wherein at least two of the electrodes have different work functions which are different by at least 0.4 V, wherein:
the first ferroelectric layer and the second ferroelectric layer are polarizable to provide at least three non-volatile states for the memory cell including a positive polarized state, a neutral polarized state and a negative polarized state;
in the positive polarized state of the memory cell, the first and second ferroelectric layers are in a positive polarized state;
in the neutral polarized state of the memory cell, the first ferroelectric layer is in the positive polarized state and the second ferroelectric layer is in the negative polarized state; and
in the negative polarized state of the memory cell, the first and second ferroelectric layers are in the negative polarized state.

2. The memory cell of claim 1, wherein:
at least two of the electrodes have work functions which are equal within a tolerance of +/−0.1 V.

3. The memory cell of claim 2, wherein:
the first and third electrodes have the different work functions; and
the first and second electrodes have work functions which are equal within the tolerance.

4. The memory cell of claim 1, wherein:
the first ferroelectric layer and the second ferroelectric layer comprise a high-k metal oxide.

5. The memory cell of claim 4, wherein:
the high-k metal oxide comprises at least one of hafnium oxide or zirconium oxide in an orthorhombic crystalline state.

6. The memory cell of claim 5, wherein:
the high-k metal oxide is doped with at least one of Al, Si or Zr.

7. The memory cell of claim 1, wherein:
the first ferroelectric layer and the second ferroelectric layer comprise a perovskite.

8. The memory cell of claim 1, wherein:
the at least two of the electrodes which have different work functions comprise TiN and Ru, respectively.

9. A method for switching a memory cell, comprising:
providing the memory cell in a first polarized state, wherein the memory cell comprises a first ferroelectric layer between a first electrode and a second electrode, and a second ferroelectric layer between the second electrode and a third electrode, at least two of the electrodes have different work functions, and the memory cell is polarizable in at least three polarized states;

providing a first bias across the memory cell which switches the memory cell from the first polarized state to a second polarized state; and providing a second bias across the memory cell which switches the memory cell from the second polarized state to a third polarized state; wherein:

in the first polarized state of the memory cell, the first and second ferroelectric layers are in a positive polarized state;

in the second polarized state of the memory cell, the first ferroelectric layer is in the positive polarized state and the second ferroelectric layer is in a negative polarized state;

in the third polarized state of the memory cell, the first and second ferroelectric layers are in the negative polarized state;

the first bias comprise a relatively weak negative bias of the first electrode; and the second bias comprise a relatively strong negative bias of the first electrode.

10. A method, comprising:

providing a memory cell in a first polarized state, wherein the memory cell comprises a first ferroelectric layer between a first electrode and a second electrode, and a second ferroelectric layer between the second electrode and a third electrode, at least two of the electrodes have different work functions, and the memory cell is polarizable in at least three polarized states;

providing a first bias across the memory cell which switches the memory cell from the first polarized state to a second polarized state; and providing a second bias across the memory cell which switches the memory cell from the second polarized state to a third polarized state, wherein:

in the first polarized state of the memory cell, the first and second ferroelectric layers are in a negative polarized state;

in the second polarized state of the memory cell, the first ferroelectric layer is in a positive polarized state and the second ferroelectric layer is in the negative polarized state;

in the third polarized state of the memory cell, the first and second ferroelectric layers are in the positive polarized state;

the first bias comprise a relatively weak positive bias of the first electrode; and the second bias comprise a relatively strong positive bias of the first electrode.

11. The method of claim 9, wherein:

the memory cell is in the first polarized state with a 0 V bias across the memory cell.

12. The method of claim 10, wherein:

the memory cell is in the first polarized state with a 0 V bias across the memory cell.

* * * * *